(12) United States Patent
Nakamura et al.

(10) Patent No.: US 9,793,482 B2
(45) Date of Patent: *Oct. 17, 2017

(54) LIGHT-EMITTING DEVICE AND METHOD FOR MANUFACTURING THE SAME

(71) Applicant: Semiconductor Energy Laboratory Co., LTD., Atsugi-shi, Kanagawa-ken (JP)

(72) Inventors: Osamu Nakamura, Kanagawa (JP); Gen Fujii, Kanagawa (JP); Fuminori Tateishi, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/280,497

(22) Filed: Sep. 29, 2016

(65) Prior Publication Data

US 2017/0018713 A1    Jan. 19, 2017

Related U.S. Application Data

(60) Continuation of application No. 15/001,439, filed on Jan. 20, 2016, now Pat. No. 9,461,076, which is a
(Continued)

(30) Foreign Application Priority Data

Nov. 14, 2003  (JP) ................................ 2003-386003

(51) Int. Cl.
*H01L 51/00*  (2006.01)
*H01L 51/56*  (2006.01)
(Continued)

(52) U.S. Cl.
CPC .......... *H01L 51/0022* (2013.01); *H01L 27/12* (2013.01); *H01L 27/124* (2013.01);
(Continued)

(58) Field of Classification Search
CPC ... H01L 51/0022; H01L 31/036; H01L 51/00; H01L 51/56; H01L 33/00; H01L 27/32;
(Continued)

(56) References Cited

U.S. PATENT DOCUMENTS 5,326,710 A   7/1994  Joyce et al.
5,747,930 A   5/1998  Utsugi
(Continued)

FOREIGN PATENT DOCUMENTS

EP    0684753 A    11/1995
JP    01-120068 A   5/1989
(Continued)

OTHER PUBLICATIONS

International Search Report (Application No. PCT/JP2004/016781) Dated March 1, 2005.
(Continued)

*Primary Examiner* — Chuong A Luu
(74) *Attorney, Agent, or Firm* — Nixon Peabody LLP; Jeffrey L. Costellia

(57) ABSTRACT

The present invention provides a display device and a manufacturing method thereof that can simplify manufacturing steps and enhance efficiency in the use of materials, and further, a manufacturing method that can enhance adhesiveness of a pattern. One feature of the invention is that at least one or more patterns needed for manufacturing a display panel, such as a conductive layer forming a wiring or an electrode or a mask for forming a desired pattern is/are formed by a method capable of selectively forming a pattern, thereby manufacturing a display panel.

17 Claims, 28 Drawing Sheets

Related U.S. Application Data continuation of application No. 13/975,586, filed on Aug. 26, 2013, now Pat. No. 9,245,922, which is a continuation of application No. 12/562,162, filed on Sep. 18, 2009, now Pat. No. 8,519,404, which is a division of application No. 10/577,425, filed as application No. PCT/JP2004/016781 on Nov. 5, 2004, now Pat. No. 7,592,207.

(51) Int. Cl.

| | | |
|---|---|---|
| *H01L 27/12* | (2006.01) | |
| *H01L 29/423* | (2006.01) | |
| *H01L 29/66* | (2006.01) | |
| *H01L 29/786* | (2006.01) | |
| *H01L 27/15* | (2006.01) | |
| *H01L 27/32* | (2006.01) | |

(52) U.S. Cl.
CPC ...... *H01L 27/1222* (2013.01); *H01L 27/1251* (2013.01); *H01L 27/1285* (2013.01); *H01L 27/1292* (2013.01); *H01L 27/156* (2013.01); *H01L 27/3262* (2013.01); *H01L 27/3279* (2013.01); *H01L 29/42384* (2013.01); *H01L 29/66765* (2013.01); *H01L 29/78669* (2013.01); *H01L 29/78696* (2013.01); *H01L 51/56* (2013.01); *H01L 2227/323* (2013.01)

(58) Field of Classification Search
CPC ......... H01L 27/12; H01L 27/15; H01L 29/04; H01L 29/78; H01L 29/786
USPC ........................................................... 257/40
See application file for complete search history.

(56) References Cited

U.S. PATENT DOCUMENTS

| | | | |
|---|---|---|---|
| 6,387,737 B1 | 5/2002 | Yamazaki et al. | |
| 6,420,834 B2 | 7/2002 | Yamazaki et al. | |
| 6,429,599 B1 | 8/2002 | Yokoyama | |
| 6,555,968 B2 | 4/2003 | Yamazaki et al. | |
| 6,673,660 B2 | 1/2004 | Komatsubara | |
| 6,715,871 B2 | 4/2004 | Hashimoto et al. | |
| 6,750,618 B2 | 6/2004 | Yamazaki et al. | |
| 6,781,162 B2 | 8/2004 | Yamazaki et al. | |
| 6,806,495 B1 | 10/2004 | Yamazaki et al. | |
| 6,828,726 B2 | 12/2004 | Sakurai et al. | |
| 6,830,494 B1 | 12/2004 | Yamazaki et al. | |
| 7,098,602 B2 | 8/2006 | Yamazaki et al. | |
| 7,136,127 B2 | 11/2006 | Furusawa | |
| 7,221,338 B2 | 5/2007 | Yamazaki et al. | |
| 7,242,024 B2 | 7/2007 | Yamazaki et al. | |
| 7,416,928 B2 | 8/2008 | Kakehata et al. | |
| 7,491,590 B2 | 2/2009 | Maekawa | |
| 7,501,754 B2 | 3/2009 | Funamoto et al. | |
| 7,623,098 B2 | 11/2009 | Yamazaki et al. | |
| 7,863,602 B2 | 1/2011 | Huh et al. | |
| 8,125,429 B2 | 2/2012 | Yamazaki et al. | |
| 9,461,076 B2 * | 10/2016 | Nakamura | H01L 27/12 |
| 2002/0093286 A1 | 7/2002 | Ohshita et al. | |
| 2002/0180371 A1 | 12/2002 | Yamazaki et al. | |
| 2003/0008429 A1 | 1/2003 | Yamazaki et al. | |
| 2003/0010283 A1 | 1/2003 | Yamazaki et al. | |
| 2003/0025118 A1 | 2/2003 | Yamazaki et al. | |
| 2003/0189400 A1 | 10/2003 | Nishio et al. | |
| 2003/0227253 A1 | 12/2003 | Seo et al. | |
| 2003/0235935 A1 | 12/2003 | Yamazaki et al. | |
| 2004/0077113 A1 | 4/2004 | Yamazaki et al. | |
| 2004/0145692 A1 | 7/2004 | Yamazaki et al. | |
| 2004/0147113 A1 | 7/2004 | Yamazaki et al. | |
| 2004/0218136 A1 | 11/2004 | Imai | |
| 2004/0224433 A1 | 11/2004 | Yamazaki et al. | |
| 2004/0253896 A1 | 12/2004 | Yamazaki | |
| 2004/0266073 A1 | 12/2004 | Yamazaki | |
| 2005/0011752 A1 | 1/2005 | Yamazaki et al. | |
| 2005/0013927 A1 | 1/2005 | Yamazaki | |
| 2005/0014319 A1 | 1/2005 | Yamazaki et al. | |
| 2005/0026410 A1 | 2/2005 | Yamazaki et al. | |
| 2005/0037614 A1 | 2/2005 | Fukuchi | |
| 2005/0043186 A1 | 2/2005 | Maekawa et al. | |
| 2005/0048289 A1 | 3/2005 | Muranaka et al. | |
| 2005/0064091 A1 | 3/2005 | Yamazaki | |
| 2005/0090029 A1 | 4/2005 | Yamazaki et al. | |
| 2005/0095356 A1 | 5/2005 | Nakamura et al. | |
| 2005/0101064 A1 | 5/2005 | Yamazaki et al. | |
| 2005/0112906 A1 | 5/2005 | Maekawa et al. | |
| 2005/0121675 A1 | 6/2005 | Maekawa et al. | |
| 2005/0122351 A1 | 6/2005 | Yamazaki et al. | |
| 2006/0199461 A1 | 9/2006 | Yamazaki et al. | |
| 2007/0120471 A1 | 5/2007 | Yamazaki et al. | |
| 2009/0134401 A1 | 5/2009 | Maekawa | |

FOREIGN PATENT DOCUMENTS

| | | |
|---|---|---|
| JP | 07-312290 A | 11/1995 |
| JP | 07-333652 A | 12/1995 |
| JP | 11-326951 A | 11/1999 |
| JP | 2001-196590 A | 7/2001 |
| JP | 2001-250953 A | 9/2001 |
| JP | 2003-058077 A | 2/2003 |
| JP | 2003-080694 A | 3/2003 |
| JP | 2003-318131 A | 11/2003 |
| JP | 2003-318401 A | 11/2003 |

OTHER PUBLICATIONS

Written Opinion (Application No. PCT/JP2004/016781) Dated March 1, 2005.

* cited by examiner

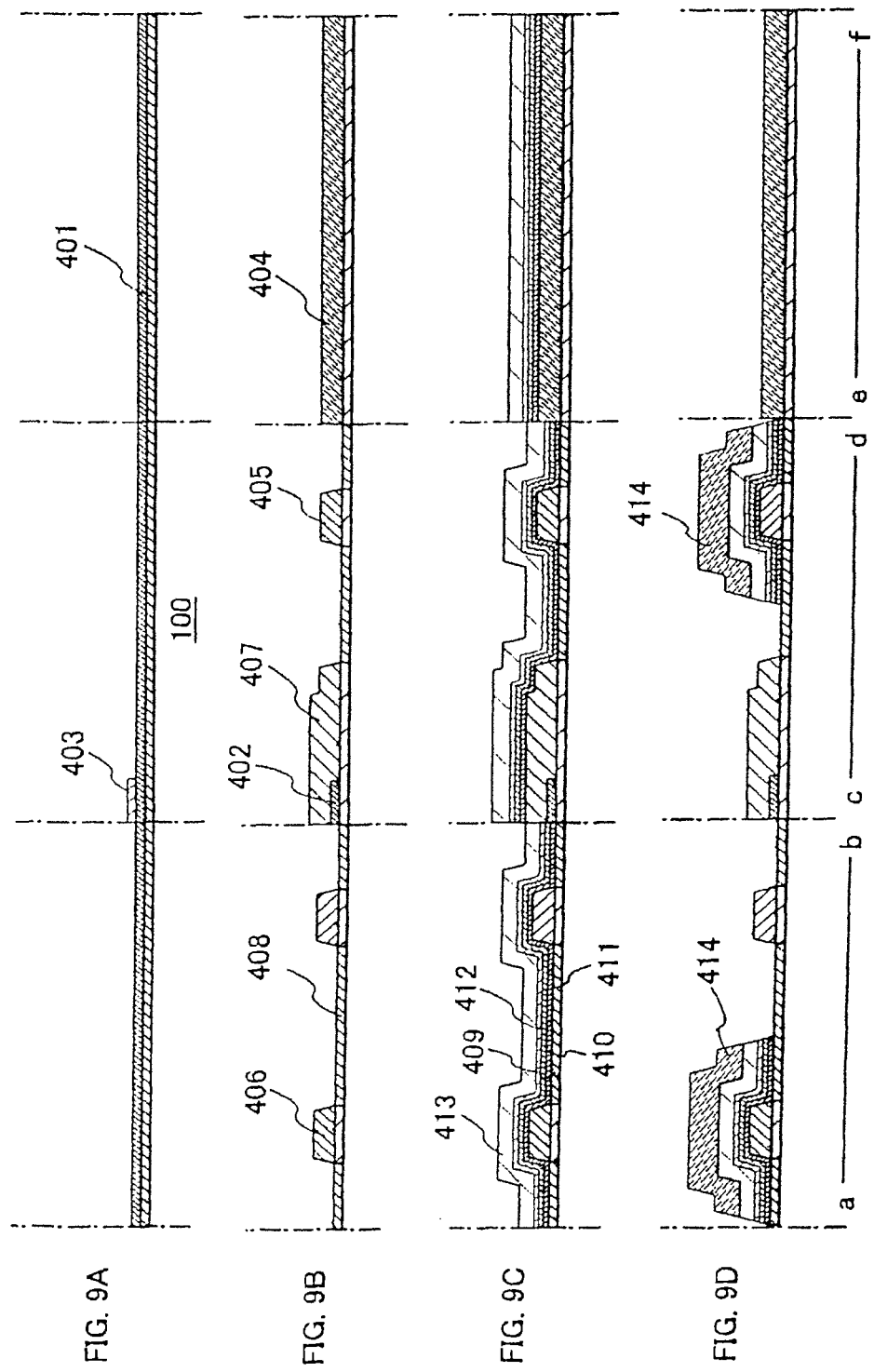

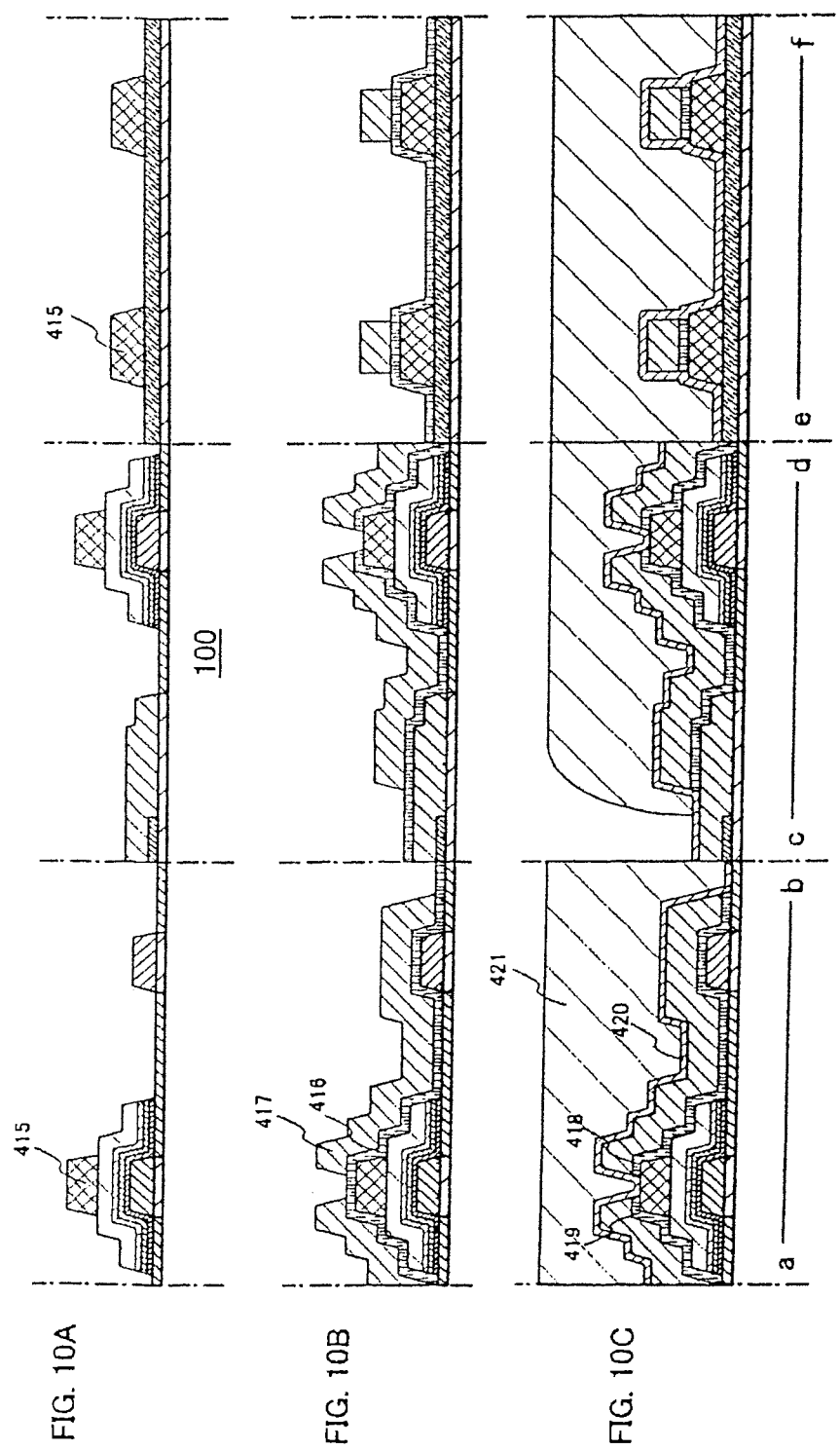

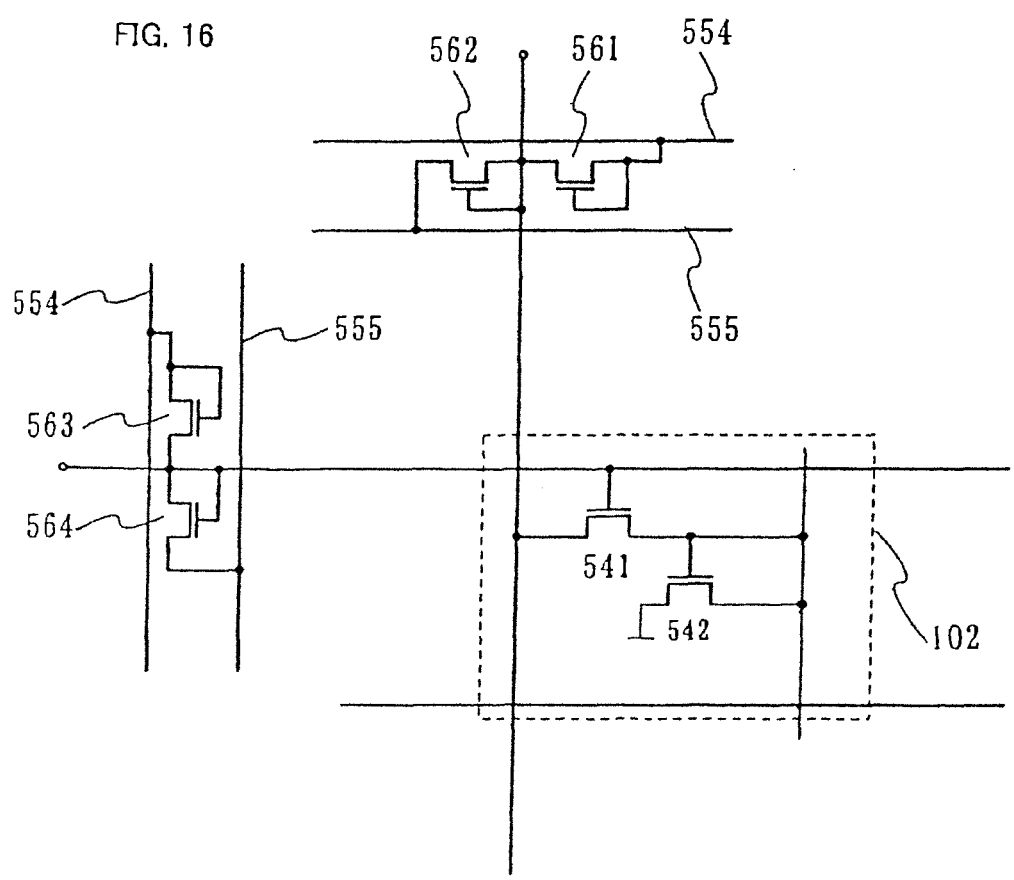

LIGHT-EMITTING DEVICE AND METHOD FOR MANUFACTURING THE SAME

This application is a CON of Ser. No. 15/001,439 filed on Jan. 20, 2016 now U.S. Pat. No. 9,461,076

TECHNICAL FIELD

The present invention relates to a light-emitting device including an active element such as a transistor formed over a large-size glass substrate and to a method for manufacturing the same.

BACKGROUND ART

Conventionally, a display panel of a so-called active matrix driving system constituted by a thin film transistor (hereinafter also referred to as a over a glass substrate is known. This active matrix display panel is manufactured by patterning various thin films by a light-exposure step using a photomask, similarly to a manufacturing technique of a semiconductor integrated circuit.

Until now, there is employed a manufacturing method for cutting out plural display panels from one mother glass substrate and mass-producing efficiently. The size of a mother glass substrate used for manufacturing display panels is increased from 300 mm×400 mm of the first generation in the early 1990s to 680 mm×880 mm or 730 mm×920 mm of the fourth generation in 2000. Furthermore, the manufacturing method has been developed so that a large number of display panels can be obtained from one substrate.

When a size of a glass substrate or a display panel is small, a patterning treatment can be carried out comparatively easily by using a photolithography apparatus. However, as a substrate size is increased, an entire surface of a display panel cannot be simultaneously treated by carrying out a light-exposure treatment once. Consequently, a method for exposing an entire surface of a substrate to light has been developed as a light-exposure treatment. (for example, consecutive light-exposure to one substrate for connecting edges of elements such as a wiring not to be disconnected at a boundary between the elements). This method is performed by dividing a region where a photoresist is applied into a plurality of block regions, carrying out a light-exposure treatment on every predetermined block regions, and by sequentially repeating them (for example, Reference 1: Japanese Patent Laid-Open No. Hei 11-326951).

DISCLOSURE OF INVENTION

However, a glass substrate is further enlarged to a size of 1000 mm×1200 mm or 1100 mm×1300 mm in the fifth generation, and a size of 1500 mm×1800 mm or more is assumed in the next generation. However, it is difficult to manufacture a display panel with good productivity and a low cost by a conventional patterning method. In other words, when a plurality of times of light-exposure treatment is carried out by the above-described consecutive light-exposure, a processing time is increased. Tremendous investment is required for developing a photolithography apparatus that can treat a large-sized glass substrate.

Moreover, there is a problem that a material cost is wasted and disposal of a large quantity of effluent is forced in a method for forming various types of thin films over an entire surface of a substrate and for removing the thin films to leave a slight region by etching, The invention has been made in view of such a problem. It is an object of the invention is to provide a light-emitting device by which efficiency in the use of a material can be improved and a manufacturing step can be simplified, and a manufacturing method thereof.

According to one aspect of the invention, at least one or more patterns needed for manufacturing a display panel, such as a conductive layer forming a wiring or an electrode or a mask for forming a desired pattern is/are formed by a method capable of selectively forming a pattern, thereby manufacturing a display panel. There is employed a droplet discharging method (referred to as an ink-jetting method depending on the system) that can form a conductive layer or an insulating layer and a desired pattern by selectively discharging droplets having a composition prepared for a particular object as the method capable of selectively forming a pattern.

A display device can be formed by using a droplet discharging method. In the display device, a TFT is connected to a light-emitting element, in which an organic material or a medium containing a mixture of art organic material and an inorganic material that generates light-emission, that is, electroluminescence (referred to as an EL) is disposed between electrodes according to one aspect of the invention.

A light-emitting device according to one aspect of the invention, comprises at least a first thin film transistor and a second thin film transistor in every pixel. The first thin film transistor and the second thin film transistor comprises a gate electrode containing a conductive material; a gate insulating layer formed over the gate electrode; a semiconductor film formed over the gate insulating layer; and a source wiring and a drain wiring formed over the semiconductor film. In the light-emitting device, one of the source wiring and the drain wiring of the first thin film transistor is connected to the gate electrode of the second thin film transistor, and the semiconductor film does not protrude from (does not extend beyond) an edge of the gate insulating layer.

A light-emitting device according to one aspect of the invention, comprises at least a first thin film transistor and a second thin film transistor in every pixel. The first thin film transistor and the second thin film transistor comprises a gate electrode containing a conductive material; a gate insulating layer formed over the gate electrode; a semiconductor film formed over the gate insulating layer; and a source wiring and a drain wiring formed over the semiconductor film. In the light-emitting device, one of the source wiring and the drain wiring of the first thin film transistor is connected to the gate electrode of the second thin film transistor, and an edge of the semiconductor film is aligned with an edge of the gate insulating layer.

A light-emitting device according to one aspect of the invention, comprises at least a switching thin film transistor and a driving thin film transistor in every pixel. The switching thin film transistor includes a first gate electrode made of a conductive material; a first island-like gate insulating layer in contact with the first gate electrode; a first island-like semiconductor film in contact with the first gate insulating layer; a second semiconductor film including one conductivity type impurity in contact with the first semiconductor layer; and a source wiring and a drain wiring in contact with the second semiconductor film including one conductivity type impurity; and the driving thin film transistor includes a second gate electrode made of the conductive material; a second island-like gate insulating layer in contact with the second gate electrode; and a third island-like semiconductor film in contact with the second gate insulating layer. In the light-emitting device, a portion of the second gate electrode is exposed, a source wiring and a drain wiring of the switching thin film transistor is connected to the gate electrode of the driving thin film transistor, and an edge of the first semiconductor film or the third semiconductor film of the switching thin film transistor and the driving thin film transistor does not protrude from an edge of the first gate insulating layer or the second gate insulating layer.

A light-emitting device according to one aspect of the invention, comprises at least a switching thin film transistor and a driving thin film transistor in every pixel. The switching thin film transistor comprises a first gate electrode made of a conductive material; a first island-like gate insulating layer in contact with the first gate electrode; a first island-like semiconductor film in contact with the first gate insulating layer; a second semiconductor film including one conductivity type impurity in contact with the first semiconductor layer; a source wiring and a drain wiring in contact with the second semiconductor film including one conductivity type impurity; and the driving thin film transistor comprises a second gate electrode made of the conductive material; a second island-like gate insulating layer in contact with the second gate electrode; a third island-like semiconductor film in contact with the second gate insulating layer. In the light-emitting device, a portion of the second gate electrode is exposed, one of the source wiring and the drain wiring of the switching thin film transistor is connected to the gate electrode of the driving thin film transistor, and an edge of the first semiconductor film or the third semiconductor film of the switching thin film transistor and the driving thin film transistor is aligned to an edge of the first gate insulating layer or the second gate insulating layer.

A light-emitting device according to one aspect of the invention, comprises at least a first thin film transistor and a second thin film transistor in every pixel. The first thin film transistor and the second thin film transistor comprise a base film; a gate electrode containing a conductive material in contact with the base film; a gate insulating layer formed over the gate electrode; a semiconductor film formed over the gate insulating layer; and a source wiring and a drain wiring formed over the semiconductor film. In the light-emitting device, one of the source wiring and the drain wiring of the first thin film transistor is connected to the gate electrode of the second thin film transistor, and an edge of the semiconductor film does not protrude from an edge of the gate insulating layer.

A light-emitting device according to one aspect of the invention, comprises a first thin film transistor and a second thin film transistor in every pixel. The first thin film transistor and the second thin film transistor comprise a base film; a gate electrode containing a conductive material in contact with the base film; a gate insulating layer formed over the gate electrode; a semiconductor film formed over the gate insulating layer; and a source wiring and the drain wiring formed over the semiconductor film. In the light-emitting device, one of the source wiring and the drain wiring of the first thin film transistor is connected to the gate electrode of the second thin film transistor, and an edge of the semiconductor film is aligned to an edge of the gate insulating layer.

A light-emitting device according to one aspect of the invention, comprises a switching thin film transistor and a driving thin film transistor in every pixel. The switching thin film transistor comprises a base film; a first gate electrode made of a conductive material in contact with the base film; a first island-like gate insulating layer in contact with the first gate electrode; a first island-like semiconductor film in contact with the first gate insulating layer; a second semiconductor film including one conductivity type impurity in contact with the first semiconductor layer; a source wiring and a drain wiring in contact with the second semiconductor film including one conductivity type impurity; and the driving thin film transistor comprises a base film; a second gate electrode made of the conductive material in contact with the base film; a second island-like gate insulating layer in contact with the second gate electrode; a third island-like semiconductor film in contact with the second gate insulating layer. In the light-emitting device, a portion of the second gate electrode is exposed, one of the source wiring and the drain wiring of the switching thin film transistor is connected to the gate electrode of the driving thin film transistor, and an edge of the first semiconductor film or the third semiconductor film of the switching thin film transistor and the driving thin film transistor does not protrude from an edge of the first gate insulating layer or the second gate insulating layer.

A light-emitting device according to one aspect of the invention, comprises a switching thin film transistor and a driving thin film transistor in every pixel. The switching thin film transistor comprises a base film; a first gate electrode made of a conductive material in contact with the base film; a first island-like gate insulating layer in contact with the first gate electrode; a first island-like semiconductor film in contact with the first gate insulating layer; a second semiconductor film including one conductivity type impurity in contact with the first semiconductor layer; and a source wiring and a drain wiring in contact with the second semiconductor film including one conductivity type impurity; and the driving thin film transistor comprises a base film; a second gate electrode made of the conductive material in contact with the base film; a second island-like gate insulating layer in contact with the second gate electrode; and a third island-like semiconductor film in contact with the second gate insulating layer. In the light-emitting device, a portion of the second gate electrode is exposed, one of the source wiring and the drain wiring of the switching thin film transistor is connected to the second gate electrode of the driving thin film transistor, and an edge of the first semiconductor film or the third semiconductor film of the switching thin film transistor and the driving thin film transistor is aligned to an edge of the first gate insulating layer or the second gate insulating layer.

In the light-emitting device according to one aspect of the invention, a protective film is formed over the semiconductor film, the first semiconductor film, or the third semiconductor film.

A method of manufacturing a light-emitting device, according to one aspect of the invention, comprises the respective steps; forming a gate electrode by a droplet discharging method over a substrate having an insulating surface or a substrate having a base surface that is exposed to a pretreatment; forming a gate insulating layer and a semiconductor film over the gate electrode; forming a first mask by a droplet discharging method over the semiconductor film; etching the semiconductor film the and gate insulating layer continuously with the first mask; removing the first mask; forming a protective layer over the semiconductor film; forming a semiconductor film including one conductivity type impurity; forming a source wiring and a drain wiring by a droplet discharging method; and etching the semiconductor film including one conductivity type impurity over the protective layer by the source and drain wiring as a second mask.

A method of manufacturing a light-emitting device having a switching thin film transistor and a driving thin film transistor in every pixel, according to one aspect of the invention, comprises the respective steps of: forming a gate electrode of a switching thin film transistor and a gate electrode of a driving thin film transistor by a droplet discharging method over a substrate having an insulating surface or a substrate having a base surface that is exposed to a pretreatment; forming a gate insulating layer and a semiconductor film over the gate electrode of the switching thin film transistor and the gate electrode of the driving thin film transistor; forming a first mask by a droplet discharging method over the semiconductor film; etching the semiconductor film and the gate insulating layer continuously with the first mask to expose a portion of the gate electrode of the driving thin film transistor; removing the first mask; forming a protective layer over the semiconductor film; forming a semiconductor film including one conductivity type impurity; forming a source wiring and a drain wiring by a droplet discharging method, at the same time, and connecting at least one of the source wiring and the drain wiring to the gate electrode of the driving thin film transistor; and etching the semiconductor film including one conductivity type impurity over the protective layer by the source wiring and the drain wiring as a second mask.

The step of forming the gate insulating layer and the semiconductor film over the gate electrodes of the switching thin film transistor and the driving thin film transistor is preferably performed continuously by a vapor phase growth method using plasma (plasma CVD) or a sputtering method without being exposed to an air.

The gate insulating layer is formed by sequentially laminating a first silicon nitride film, a silicon oxide film and a second silicon nitride film. Thus, the gate insulating layer can prevent oxidation of a gate electrode and form a favorable interface with a semiconductor film to be formed over the gate insulating layer.

As described above, a mask to be used in patterning a gate insulating layer and a semiconductor film is formed by a droplet discharging method, and the semiconductor film and the gate insulating layer are etched continuously, according to one aspect of the invention.

A method of manufacturing a light-emitting device, according to one aspect of the invention, comprises the respective steps of: forming a gate electrode by a droplet discharging method over a substrate having an insulating surface or a substrate having a base surface that is exposed to a pretreatment; forming a base film over the gate electrode as a pretreatment; forming a gate insulating layer and a semiconductor film over the base film; forming a first mask by a droplet discharging method over the semiconductor film; etching the semiconductor film and the gate insulating layer continuously with the first mask; removing the first mask; forming a protective layer over the semiconductor film; forming a semiconductor film including one conductivity type impurity; forming a source wiring and a drain wiring by a droplet discharging method; and etching the semiconductor film including one conductivity type impurity over the protective layer by the source wiring and the drain wiring as a second mask.

A method of manufacturing a light-emitting device having a switching thin film transistor and a driving thin film transistor in every pixel, according to one aspect of the invention, comprises the respective steps of: forming a gate electrode of a switching thin film transistor and a gate electrode of a driving thin film transistor by a droplet discharging method over a substrate having an insulating surface or a substrate having a base surface that is exposed to a pretreatment; forming a base film over the gate electrode of the switching thin film transistor and the gate electrode of the driving thin film transistor as a pretreatment; forming a gate insulating layer and a semiconductor film over the base film; forming a first mask by a droplet discharging method over the semiconductor film; etching the semiconductor film and the gate insulating layer continuously with the first mask to expose a portion of the gate electrode of the driving thin film transistor; removing the first mask; forming a protective layer over the semiconductor film; forming a semiconductor film including one conductivity type impurity; forming a source wiring and a drain wiring by a droplet discharging method, at the same time, and connecting at least one of the source wiring and the drain wiring to the gate electrode of the driving thin film transistor; and etching the semiconductor film including one conductivity type impurity over the protective layer by the source wiring and the drain wiring as a second mask.

In the step of forming the gate insulating layer and the semiconductor film over the base film, it is preferable that the gate insulating layer and the semiconductor film are sequentially formed by a vapor phase growth method using plasma (plasma CVD) or a sputtering method without being exposed to the atmosphere.

The gate insulating layer is formed by sequentially laminating a first silicon nitride film and a silicon oxide film and a second silicon nitride film. Thus, the gate insulating layer can prevent oxidation of a gate electrode and form a favorable interface with a semiconductor film to be formed over the gate insulating layer.

As described above, a mask to be used in patterning a gate insulating layer and a semiconductor film is formed by a droplet discharging method, and the semiconductor film and the gate insulating layer are etched continuously.

According to the present invention, a gate electrode and a wiring is formed by a droplet discharging method, and Ag or Cu can be used for the conductive material. Also, an alloy containing Ag or Cu or a lamination of Ag and Cu can be also used. A silicon nitride film or a silicon oxynitride film is formed to be contact with a top surface of the gate electrode or the wiring, thereby preventing deterioration due to oxidation. Au, W, or Al may be used as the conductive material.

In the invention, the semiconductor film, which is a main portion of a TFT, can be also formed from a semi-amorphous semiconductor containing hydrogen and halogen, and having a crystal structure. Accordingly, a driver circuit only including an n-channel type thin film transistor can be provided. In other words, it is possible to form a driver circuit over one substrate by using a TFT in which a semiconductor containing hydrogen and halogen, and having a crystal structure is used as a semiconductor film and which can operate with an electric field effect mobility of 1 to 15 $cm^2/V \cdot sec\ cm^2$.

According to one aspect of the invention, patterning of a wiring or a mask can be carried out directly by a droplet discharging method. Therefore, a thin film transistor by which efficiency in the use of a material is improved and a manufacturing step is simplified, and a display device using the thin film transistor can be obtained.

It is necessary that an active matrix system used for an EL display panel has a function of selecting a particular pixel and providing a necessary display information and a function of flowing current to a light-emitting element during one frame period. A driving thin film transistor for supplying current to a light-emitting element and a switching thin film transistor are required for achieving the two functions simultaneously. A contact portion is needed, since the switching thin film transistor should be connected to the driving thin film transistor electrically. According to the invention, a mask to be used in patterning the gate insulating layer and the semiconductor film is formed by a droplet discharging method, and the semiconductor film and the gate insulating layer are etched continuously. Thus, a gate electrode of the driving thin film transistor is exposed and can be easily have a contact with a source and drain wiring of the switching thin film transistor.

BRIEF DESCRIPTION OF DRAWINGS

In the accompanying drawings:

FIGS. 9A to 9D are cross-sectional views each showing a manufacturing step of an EL display panel according to one aspect of the present invention;

FIGS. 10A to 10C are cross-sectional views each showing a manufacturing step of an EL display panel according to one aspect of the present invention;

FIG. 16 is an equivalent circuit diagram of the liquid-crystal display panel shown in FIG. 15;

BEST MODE FOR CARRYING OUT THE INVENTION

Figure 1:
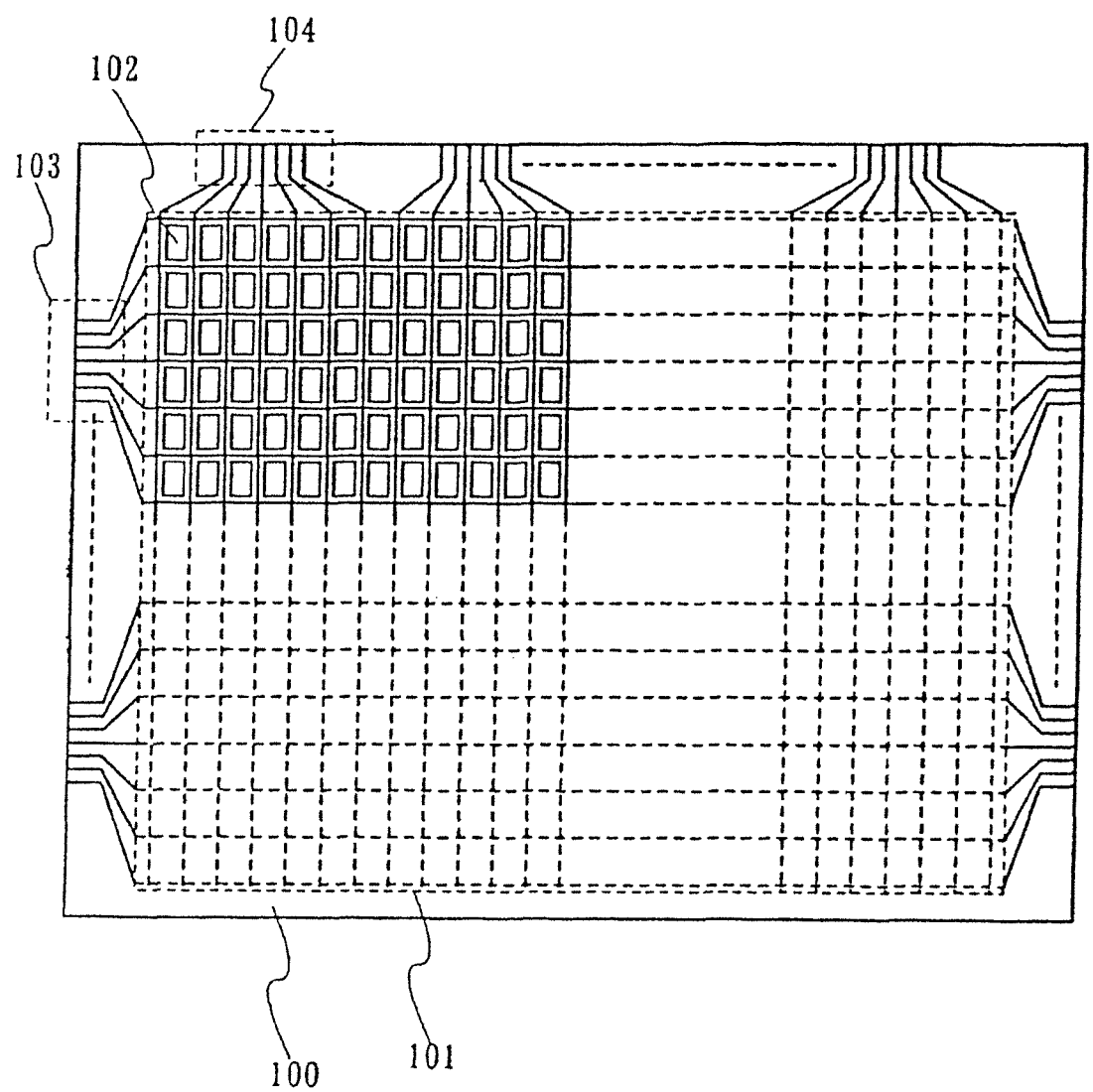
FIG. 1 is a top view showing a configuration of an EL display panel according to one aspect of the present invention.

Embodiment modes of the present invention will be explained in detail with reference to the drawings. Note that the same reference numerals denote the same parts among each drawing, and the explanation will not be repeated in the following explanations. In addition, it is to be understood that various changes and modifications will be apparent to those skilled in the art, unless such changes and modifications depart from content and the scope of the invention. Therefore, the invention is not interpreted with limiting to the description in the following embodiment modes.

FIG. 1 shows a top view of a structure of an EL display panel according to the invention. A pixel portion 101 in which pixels 102 are arranged in a matrix, a scanning line input terminal 103, and a signal line input terminal 104 are formed on a substrate 100 having an insulating surface. The number of pixels may be provided according to various standards. The number of pixels of XGA may be 1024×768×3 (RGB), the one of UXGA may be 1600×1200×3 (RGB), and the one of a full-spec Hi-Vision (high-definition) may be 1920×1080×3 (RGB).

The pixels 102 are arranged in a matrix by intersecting a scanning line extended from the scanning line input terminal 103 with a signal line extended from the signal line input terminal 104. A thin film transistor for controlling a connection state with the signal line (hereinafter, also referred to as a "switching thin film transistor" or a "switching TFT") and a thin film transistor for controlling current flowing into a light-emitting element (hereinafter, also referred to as a "driving thin film transistor" or a "driving TFT") are provided for each of the pixels 102, and the driving thin film transistor is connected in series to the light-emitting element.

A TFT comprises a semiconductor film, a gate insulating layer, and a gate electrode as the main components. A wiring connected to a source and drain region formed in the semiconductor film is included too. A top gate type in which a semiconductor film, a gate insulating layer, and a gate electrode are arranged from a substrate side; a bottom gate type in which a gate electrode, a gate insulating layer, and a semiconductor film are arranged from a substrate side; and the like are known as a structure of a TFT. However, any one of structures may be applied to the invention.

An amorphous semiconductor (hereinafter also refereed to as an "AS") manufactured by using a semiconductor material gas typified by silane or germane with a vapor phase growth method or a sputtering method; a polycrystalline semiconductor that is formed by crystallizing the amorphous semiconductor by utilizing light energy or thermal energy; a semi-amorphous semiconductor (also referred to as microcrystallite or microcrystal, and hereinafter also referred to as an "SAS"); and the like can be used for a material to form a semiconductor film.

An SAS is a semiconductor with an intermediate structure between an amorphous and a crystal structure (including a single crystal and a polycrystal). This is a semiconductor having a third condition that is stable free-energetically, and a crystalline region having a short-range order and lattice distortion is included therein. A crystalline region of from 0.5 nm to 20 nm can be observed at least in a portion of a region in the film. When silicon is contained as the main component, Raman spectrum is shifted to a lower frequency side less than 520 $cm^{-1}$. Diffraction peak of (111) or (220) to be caused from a crystal lattice of silicon is observed in X-ray diffraction. At least 1 atomic % or more of hydrogen or halogen is contained as a neutralizer of a dangling bond. An SAS is formed by carrying out glow discharge decomposition (plasma CVD) on a silicide gas. $Si_2H_6$, $SiH_2Cl_2$, $SiHCl_3$, $SiCl_4$, $SiF_4$, or the like can be used for the silicide gas, in addition to $SiH_4$. In addition, $GeF_4$ may be mixed. This silicide gas may be diluted with $H_2$ or $H_2$ and one or more of the rare gas elements of He, Ar, Kr, and Ne. A dilution ratio ranges from 2 times to 1000 times. A pressure ranges approximately from 0.1 Pa to 133 Pa, and a power frequency ranges from 1 MHz to 120 MHz, preferably from 13 MHz to 60 MHz. A substrate heating temperature may be 300° C. or less. It is desirable that an atmospheric constituent impurity such as oxygen, nitrogen, or carbon is $1 \times 10^{20}$ atoms/$cm^3$ or less as an impurity element in the film, specifically an oxygen concentration is $5 \times 10^{19}$ atoms/$cm^3$ or less, preferably $1 \times 10^{19}$ atoms/$cm^3$ or less.

Figure 2:
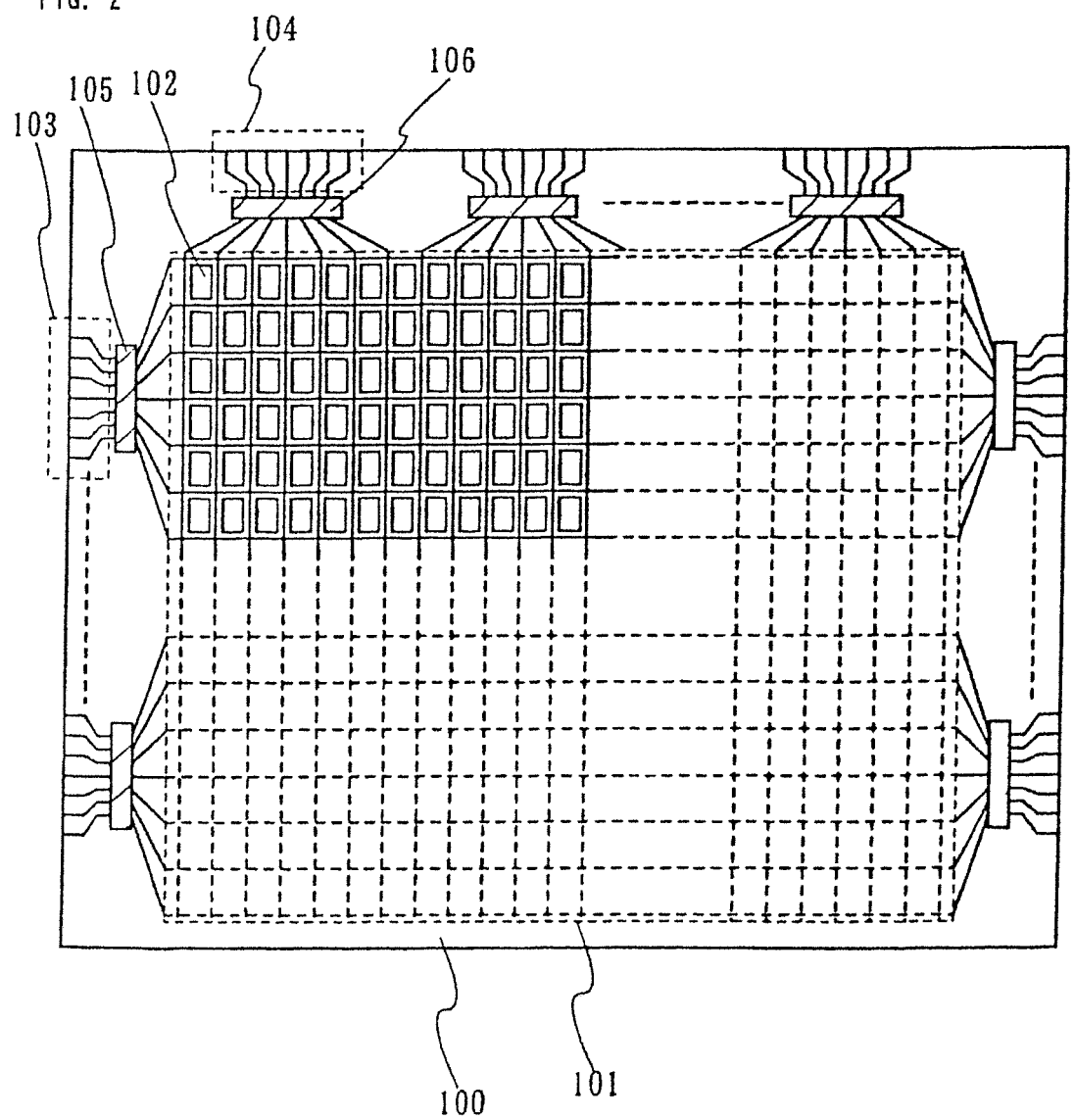
FIG. 2 is a top view showing a configuration of an EL display panel according to one aspect of the present invention.

FIG. 1 shows a structure of an EL display panel that controls a signal inputted into a scanning line and a signal line by an external driver circuit. Furthermore, a driver ICs 105 and 106 may be mounted on a substrate 100 by COG (Chip on Glass) as shown in FIG. 2. The driver ICs may be formed on a single crystal semiconductor substrate or may be formed from a circuit with a TFT on a glass substrate.

Figure 3:
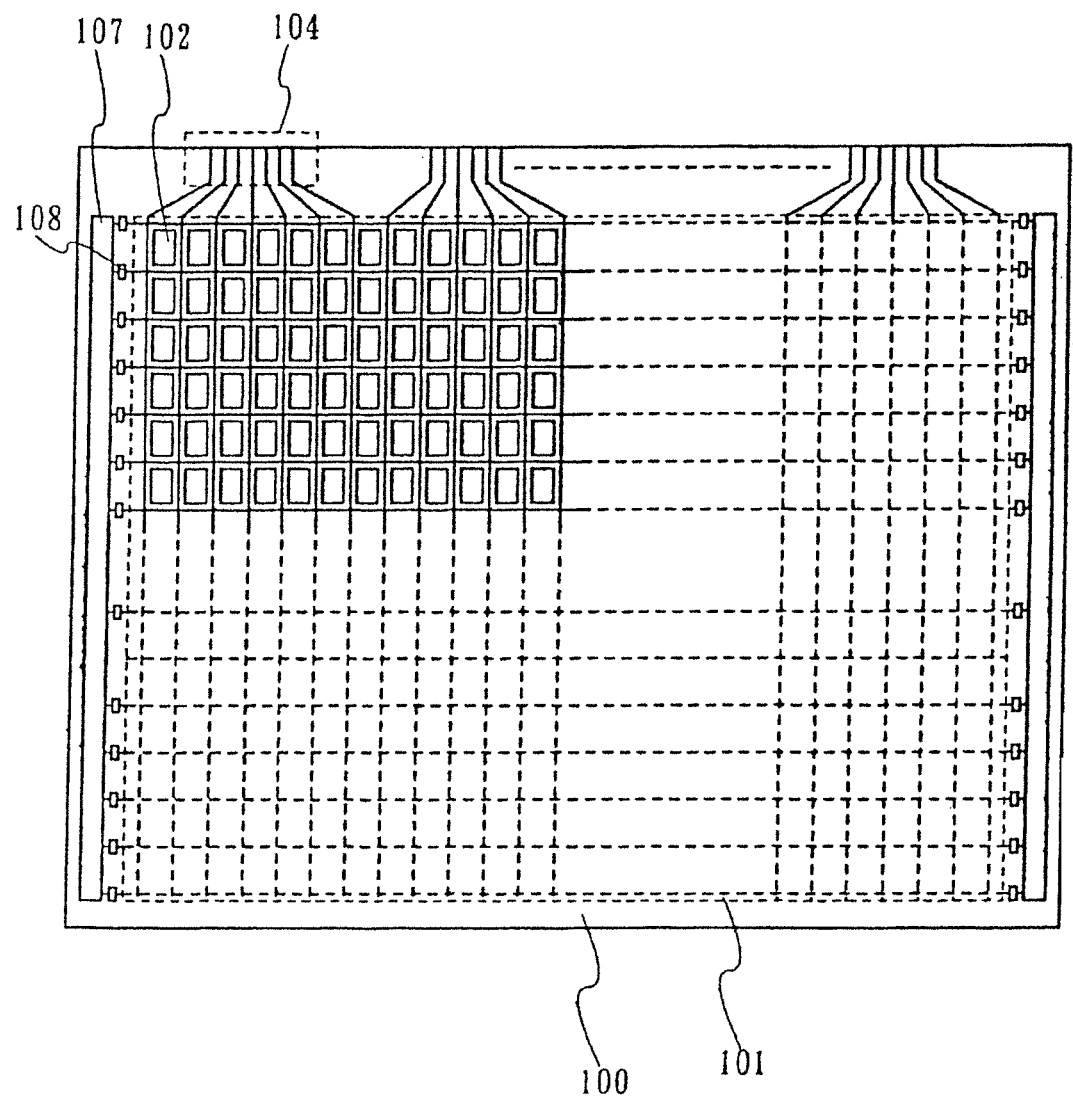
FIG. 3 is a top view showing a configuration of an EL display panel according to one aspect of the present invention.

When a TFT provided for a pixel is formed from an SAS, a scanning line driver circuit 107 can be integrally formed on the substrate 100, as shown in FIG. 3. Reference numeral 108 denotes a protection diode.

Figure 25:
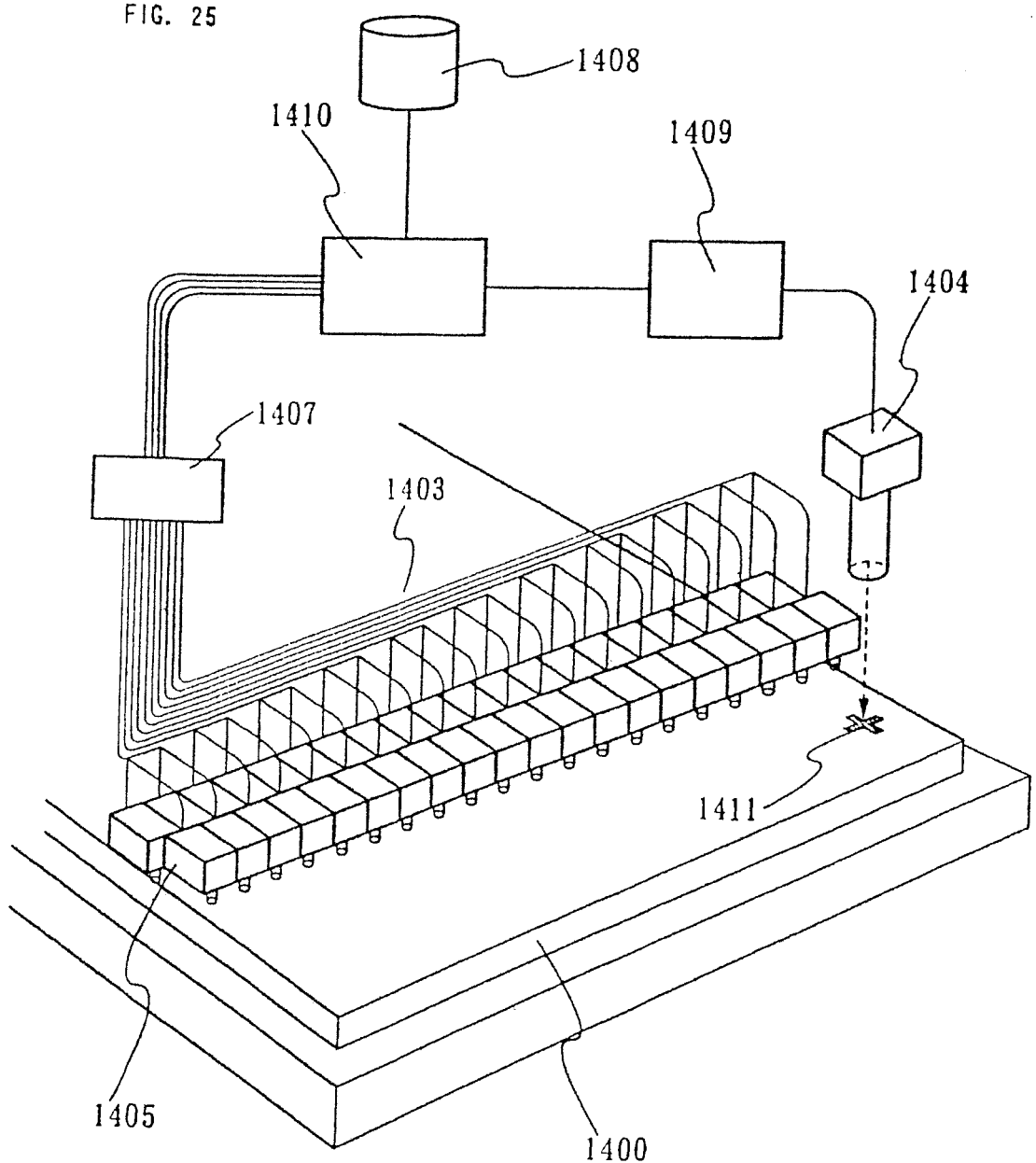
FIG. 25 shows a structure of a droplet discharging apparatus which can be applied to the present invention.

FIG. 25 shows one mode of a droplet discharging apparatus used for forming patterns. Each head 1405 of a droplet discharge unit 1403 is individually connected to a control unit 1407. A pattern that is programmed in advance can be drawn with a control of the control unit 1407 using a computer 1410. The timing of drawing a pattern may be decided based on a marker 1411 formed on a substrate 1400, for example. In addition, a reference point may be fixed with an edge of the substrate 1400 as a reference. A reference point is detected by an imaging unit 1404 such as a CCD, and the computer 1410 recognizes a digital signal converted by an image processing unit 1409 to generate a control signal, and the control signal is transmitted to the control unit 1407. Of course, information of a pattern to be formed on the substrate 1400 is placed in a recording medium 1408. Based on this information, the control signal can be transmitted to the control unit 1407, and thus, each head 1405 of the droplet discharging unit 1403 can be controlled individually. Now, an apparatus that can discharge a metal, an organic material, and an inorganic material individually with one head, as discharging RGB respectively with one ink jet head like EL, has been developed. In the case of discharging an interlayer insulating film widely, multiple thin lines may be drawn by using the same material so as to enhance throughput. According to a droplet discharging apparatus shown in FIG. 25, a length in which heads 1405 of the droplet discharging unit 1403 are arranged is equal to a width of a substrate 1400. However, the droplet discharging apparatus can form a pattern by repeatedly scanning to a large size substrate having a broader width than the length in which heads 1405 are arranged.

Next, a step of manufacturing an EL display panel using such a droplet discharging apparatus is explained hereinafter.

Embodiment Mode 1

A method for manufacturing a channel protective type TFT is explained in Embodiment mode 1.

Figure 4:
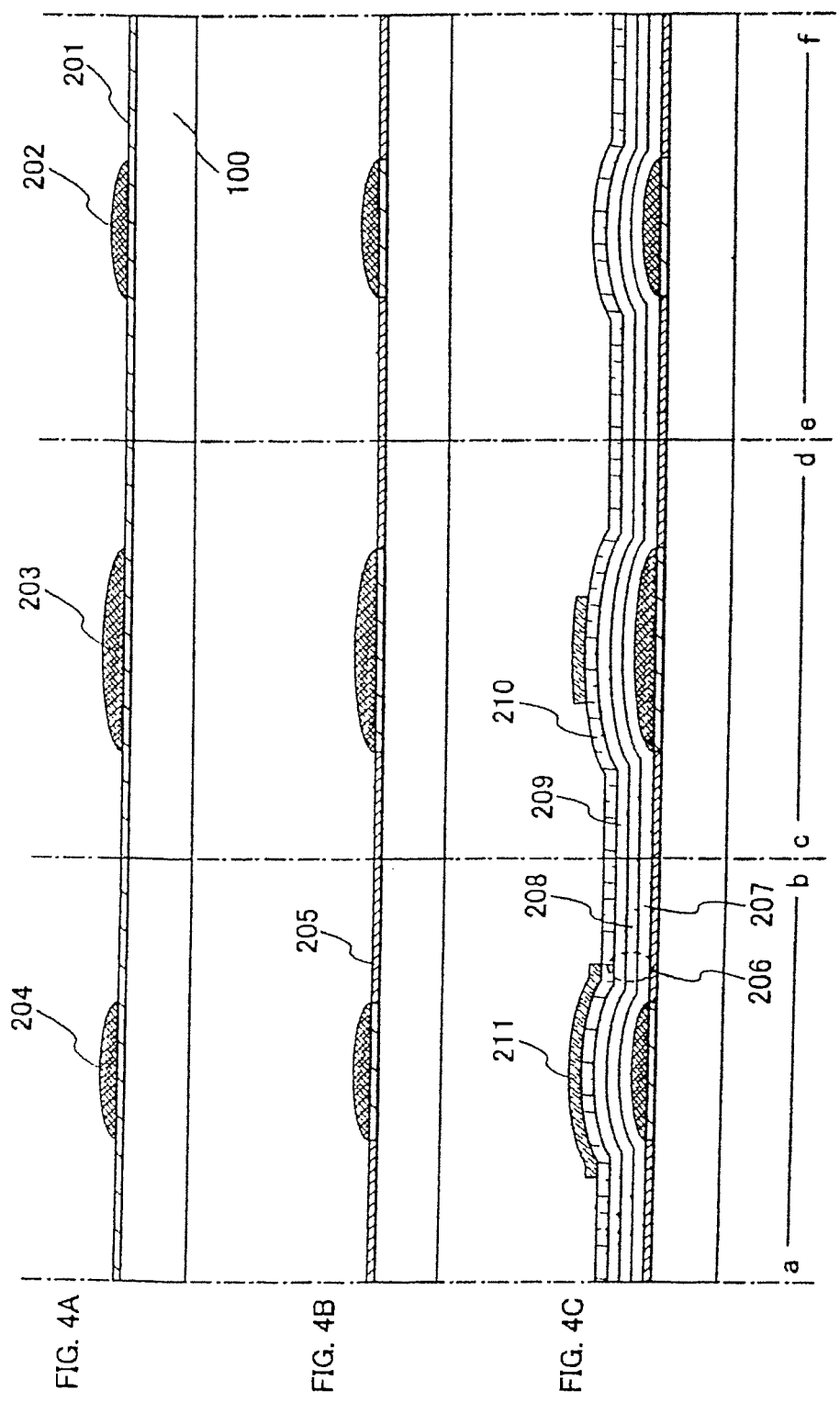
FIGS. 4A to 4C are cross-sectional views each showing a manufacturing step of an EL display panel according to one aspect of the present invention.
Figure 8:
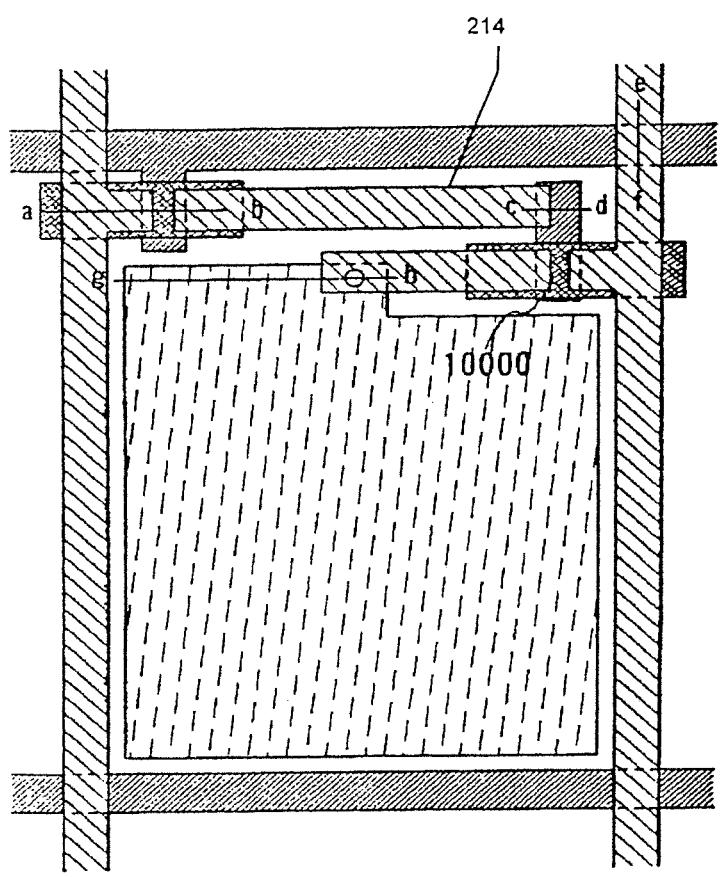
FIG. 8 is a top view showing a manufacturing step of an EL display panel according to one aspect of the present invention.

FIG. 4A shows a step of forming a gate electrode, and a gate wiring connected to the gate electrode over a substrate 100 by a droplet discharging method. Note that FIG. 4A shows a longitudinal sectional structure schematically, and FIG. 8 shows a planar structure corresponding to a-b, c-d and e-f thereof, and thus, the figures can be referred to at the same time.

A plastic substrate having the heat resistance that can withstand processing temperature of the manufacturing step, or other substrates can be used for the substrate 100, in addition to a non-alkaline glass substrate such as barium borosilicate glass, alumino borosilicate glass, or aluminosilicate glass manufactured with a fusion method or a floating method, and a ceramic substrate. A semiconductor substrate such as single crystal silicon, a substrate in which a surface of a metal substrate such as stainless is provided with an insulating layer may be also employed.

A base film 201 formed from a metal material such as Ti (titanium), W (tungsten), Cr (chromium), Ta (tantalum), Ni (nickel), or Mo (molybdenum), an oxide thereof, a photocatalyst or the like is preferably formed on the substrate 100 by a sputtering method, an evaporation method, or a droplet discharging method. The base film 201 may be formed to have a film thickness of from 0.01 nm to 10 nm; however, a layer structure is not necessarily needed since it may be formed extremely thin. Note that this base film 201 is provided to form the gate electrode with good adhesiveness. When adequate adhesiveness is obtained, the gate electrode may be directly formed on the substrate 100 by a droplet discharging method without forming the base film 201. Alternatively, an atmospheric plasma treatment may be performed. Without limiting to this step, in the case where a conductive layer is formed over an organic layer, an inorganic layer, a metal layer or the like by a droplet discharging method, or an organic layer, an inorganic layer, a metal layer or the like is formed over a conductive layer formed by a droplet discharging method, the same treatment may be performed so as to the adhesiveness with the conductive layer.

A gate wiring 202, and gate electrodes 203 and 204 are formed on the base film 201 by discharging a composition containing a conductive material by a droplet discharging method. The composition containing particles of a metal such as Ag (silver), Au (gold), Cu (copper), W (tungsten), or Al (aluminum) as the main component can be used as the conductive material for forming these layers. Further, a composition mainly containing Cu particles coated with Ag, or particles using Ni (nickel) or NiB (nickel boron) as the buffer layer may be employed. Specifically, the gate wiring is preferable to be low resistance. Therefore, a composition in which any one of gold, silver, or copper dissolved or dispersed in a solvent is preferably used, and more preferably silver or copper with low resistance may be used in consideration of a specific resistance value. Alternatively, a lamination of silver and copper may be used. Silver that has been applied very thinly may be plated with copper to be a thicker wiring, since silver is so expensive. The surface of the applied silver is rough and easy to be plated. As the plating method, there are a method of dipping a substrate into a plating solution, a method of flowing a plating solution over a substrate, and the like. When silver and copper are used, a barrier layer may be provided additionally as a measure against impurities. Nickel boron (NiB) may be used for the barrier layer as well as a silicon nitride film. The surface can be smoothed by nickel boron. A solvent corresponds to ester such as butyl acetate, alcohols such as isopropyl alcohol, an organic solvent such as acetone, and the like. Surface tension and viscosity are appropriately adjusted by adjusting density of a solvent and adding a surface activator or the like.

A diameter of a nozzle used in a droplet discharging method is set to be from 0.02 μm to 100 μm (preferably, 30 μm or less), and a discharging amount of a composition discharged from the nozzle is preferably set to be from 0.001 pl to 100 pl (more preferably, 10 pl or less). There are two types of an on-demand type and a continuous type for a droplet discharging method, either of which may be used. Furthermore, there is a piezoelectric system using properties of transforming by applying voltage to a piezoelectric material and a heating system that boils a composition by a heater provided in a nozzle and discharges the composition for a nozzle to be used in a droplet discharging method, either of which may be used. A distance between an object and a discharging outlet of a nozzle is preferable to be made as close as possible to drop a droplet at a desired place, which is preferably set to be from 0.1 mm to 3 mm (more preferably, 1 mm or less). While keeping the relative distance, either the nozzle or the object moves and thus, a desired pattern is drawn. A plasma treatment may be carried out on a surface of the object before discharging a composition. This is because an advantage that a surface of the subject becomes hydrophilic and lyophobic when the plasma treatment is carried out, can be obtained. For example, it becomes hydrophilic to purified water and it becomes lyophobic to a paste dissolved with alcohol.

The step of discharging a composition may be performed under low pressure. This is because a solvent of the composition is volatilized until the composition is attached onto an object since it is discharged. Thus, steps of baking and drying later can be omitted or performed with a shorter time. After discharging the composition, either or both steps of drying and baking is/are carried out by irradiation of laser light, rapid thermal annealing, heating furnace, or the like under atmospheric pressure or low pressure. Both the steps of drying and baking are steps of heat treatment. For example, drying is carried out at 100° C. for 3 minutes and baking is carried out at temperatures from 200° C. to 350° C. for 15 to 120 minutes. The steps of baking and drying have each different object, and need each different temperature and time. In order to carry out the steps of drying and baking favorably, a substrate may be heated, of which temperatures are set to be from 100° C. to 800° C. (preferably, temperatures from 200° C. to 350° C.), depending on a material of a substrate or the like. Through this step, a solvent in a composition is volatilized or dispersant is removed chemically, and the resin in the periphery cures and shrinks, thereby accelerating fusion and welding. It is carried out under an oxygen atmosphere, a nitrogen atmosphere, or the air. However, this step is preferable to be carried out under an oxygen atmosphere in which a solvent decomposing or dispersing a metal element is easily removed.

A continuous-wave or pulsed gas laser or solid state laser may be used for irradiation with laser light. There is an excimer laser or the like as the gas laser, and there is a laser using a crystal such as YAG or YVO$_4$ doped with Cr, Nd, or the like as the solid state laser. It is preferable to use a continuous-wave laser in terms of the laser light absorptance. In addition, a so-called hybrid method of laser irradiation combining a continuous oscillation and a pulsed oscillation may be also used. However, a heat treatment by irradiation of laser light may be carried out rapidly for several microseconds to several tens of seconds, based on the heat resistance of a substrate. Rapid Thermal Annealing (RTA) is carried out by applying heat rapidly for several microseconds to several minutes by rapidly raising temperature by using a halogen lamp, an infrared lamp that emits light from ultraviolet light to infrared light, or the like under an atmosphere of an inert gas. This treatment is carried out rapidly; therefore, substantially, only a thin film of an uppermost surface can be heated, and thus, there is advantage that the lower layer is not affected.

After forming the gate wiring 202, and the gate electrodes 203 and 204, it is desirable to carry out one of the following two steps for a treatment of the base film 201 which is exposed in the surface.

A first method is a step of forming an insulating layer 205 by insulating the base film 201 not overlapping with the gate wiring 202, the gate electrodes 203 and 204 (FIG. 4B). In other words, the base film 201 not overlapping with the gate wiring 202, the gate electrodes 203 and 204 are oxidized and insulated. In the case of insulating the base film 201 by oxidizing in this manner, the base film 201 is preferably formed to have a film thickness of from 0.01 nm to 10 nm, so that it can be easily oxidized. Note that either a method of exposing to an oxygen atmosphere or a heat treatment may be used as the oxidizing method.

A second method is a step of etching and removing the base film 201, using the gate wiring 202, the gate electrodes 203 and 204 as a mask. In the case of using this step, there is no restriction on a film thickness of the base film 201.

Next, a gate insulating layer 206 is formed with a single layer structure or a laminated structure by using a plasma CVD method or a sputtering method (FIG. 4C). As a specifically preferable mode, a lamination body of three layers of an insulating layer 207 made from silicon nitride, an insulating layer 208 made from silicon oxide, and an insulating layer 209 made from silicon nitride is formed as the gate insulating layer. Note that a rare gas such as argon may be contained in a reactive gas and mixed into an insulating layer to be formed in order to form a dense insulating layer with little gale leak current at a low deposition temperature. Deterioration by oxidation can be prevented by forming a first layer to be in contact with the gate wiring 202, the gate electrodes 203 and 204 from silicon nitride or silicon oxynitride. Nickel boron (NiB) is used for the first layer to be in contact with the gate wiring 202, and the gate electrodes 203 and 204. Thus, the surface can be smoothed.

Next, a semiconductor film 210 is formed. The semiconductor film 210 is formed from an AS or SAS manufactured with a vapor phase growth method by using a semiconductor material gas typified by silane or germane or a sputtering method. A plasma CVD method or a thermal CVD method can be used as the vapor phase growth method.

In the case of using a plasma CVD method, an AS is formed from $SiH_4$ which is a semiconductor material gas or a mixed gas of $SiH_4$ and $H_2$. When $SiH_4$ is diluted with $H_2$ 3 times to 1000 times to make a mixed gas or when $Si_2H_6$ is diluted with $GeF_4$ so that a gas flow rate of $Si_2H_6:GeF_4$ is from 20 to 40:0.9, an SAS of which Si composition ratio is 80% or more can be obtained. Specifically, the latter case is preferable since the semiconductor film 210 can have crystallinity from an interface with the base.

A mask 211 is formed at a position corresponding the gate electrodes 203 and 204 by discharging selectively a composition over the semiconductor film 210. A resin material which is one selected from a group of an epoxy resin, an acrylic resin, a phenol resin, a novolac resin, a melamine resin and a urethane resin is used for the mask 211. Also the mask 211 is formed by a droplet discharging method using an organic material such as benzocyclobutene, parylene, flare, or light-transmitting polyimide; a compound material made from polymerization such as siloxane-based polymer; a composition material containing water-soluble homopolymer and water-soluble copolymer; or the like. Alternatively, a commercial resist material containing a photosensitive agent may be used. For example, a typical positive type resist that a novolac resin, naphthoquinone diazide compounds as a photosensitive agent and the like are dissolved or dispersed with a known solvent; and a negative type resist that a base resin, diphenylsilanediol, an asid generation agent and the like are dissolved or dispersed with a known solvent may be used. In using any one of materials, surface tension and viscosity are appropriately adjusted by adjusting a concentration of a solvent or adding a surface activator or the like.

Figure 5:
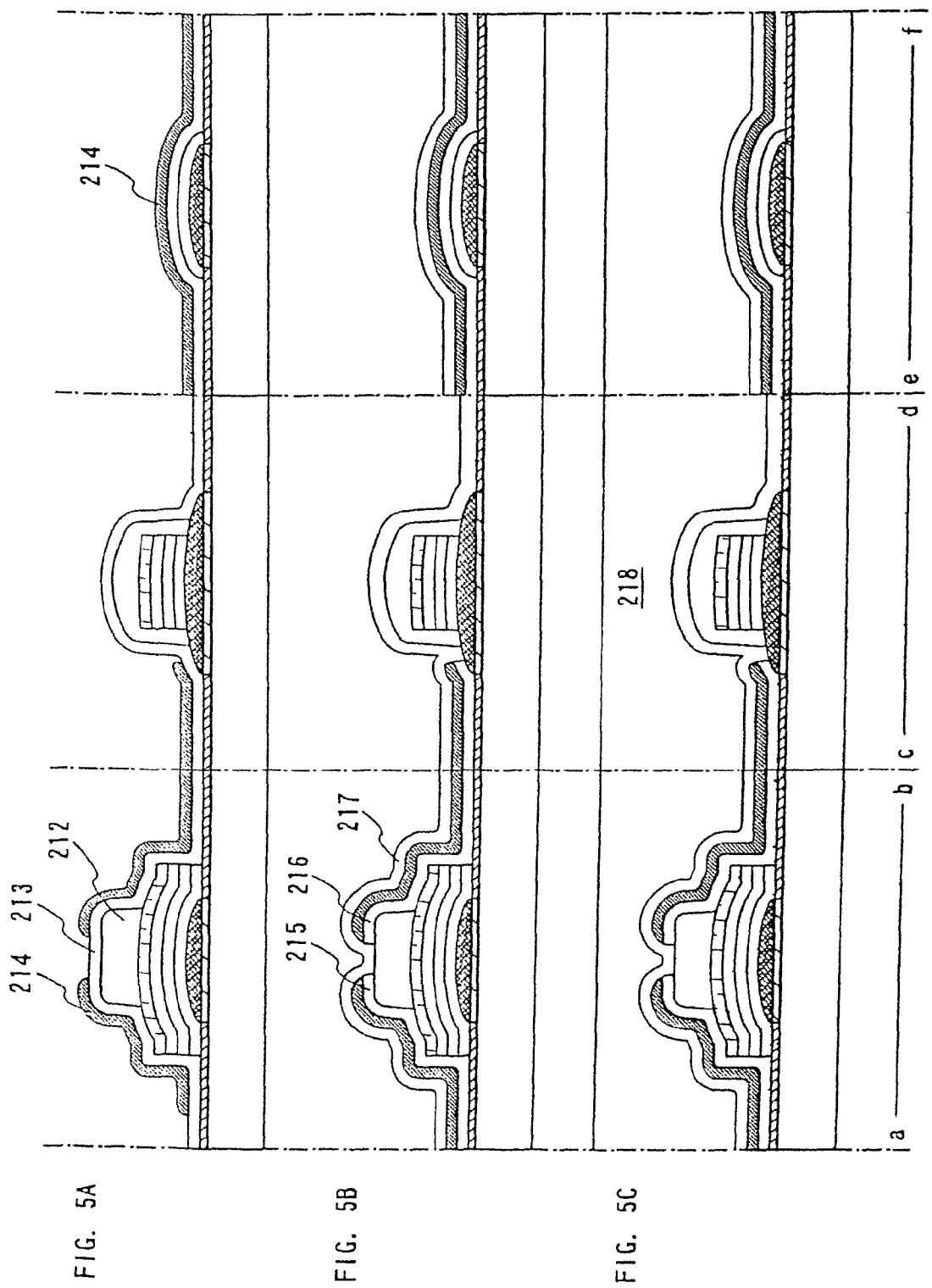
FIGS. 5A to 5C are cross-sectional views each showing a manufacturing step of an EL display panel according to one aspect of the present invention.

The gate insulating layer 206 and the semiconductor film 210 are etched using the mask 211 (FIG. 5A). Consequently, the semiconductor film is formed so that an edge thereof does not protrude from (is not beyond) an edge of the gate insulating layer. Alternatively it is can be said that the semiconductor film is formed so that an edge thereof is aligned to an edge of the gate insulating layer. In other words, the edges exist straight. Either plasma etching or wet etching may be applied for the etching step. Plasma etching is suitable for processing a large-sized substrate. A etching gas which is at least one selected from the group of $CF_4$, $NF_3$ and the like as a fluorine-based gas and $Cl_2$, $BCl_3$ and the like as a chlorine-based gas is used, and any one of He, Ar and the like may be added appropriately. In addition, when an etching step of atmospheric pressure discharging is applied, a local discharging process is also possible. Then, the mask 211 is removed, and a protective layer 212 is formed by a droplet discharging method over the semiconductor film 210. The protective layer 212 is an insulating layer, and can be formed from an inorganic insulating material such as silicon oxide, silicon nitride, silicon oxynitride, aluminum oxide, aluminum nitride, aluminum oxynitride; acrylic acid, methacrylic acid, and a derivative thereof; a heat-resistance high-polymer (high-molecular weight) material such as polyimide, aromatic polyamide, or polybenzimidazole; inorganic siloxane including a Si—O—Si bond, among the compounds made from silicon, oxygen and hydrogen, formed by using a siloxane-based material as a start material; or an organic siloxane insulating material in which hydrogen on silicon is substituted by an organic group such as methyl or phenyl. When the protective layer is formed from a material such as photosensitive acrylic or photosensitive polyimide, it is preferable since the side face thereof has a shape in which a curvature radius changes continuously and a thin film in the upper layer is formed without break. Thus protective layer has functions of ensuring cleanness at the interface and preventing the semiconductor film 210 from being contaminated by an organic material, a metal, water vapor or the like. The protective layer also has a function as an interlayer film.

The protective layer 212 may be formed by the following method. Initially, an insulating layer such as silicon oxide, silicon nitride, or silicon oxynitride is formed by plasma CVD over the semiconductor film 210. Then, the protective layer 212 is formed by a droplet discharging method and the protective layer 212 is used as a mask to perform an etching step. Thus, the insulating layer lies under the protective layer 212, and a protective layer can be formed from a lamination of the insulating layer and a siloxane based material or the like.

Next, an n-type semiconductor film 213 is formed. The n-type semiconductor film 213 may be formed by using a silane gas and a phosphine gas, and can be formed with AS or SAS. A composition including a conductive material is discharged selectively to form a source and drain wiring 214 by a droplet discharging method (FIG. 5A). As the conductive material for forming a wiring, a composition mainly containing a metal particle such as Ag (silver), Au (gold), Cu (copper), W (tungsten), or Al (aluminum) can be used. A lamination of silver and copper or the like may be used. A light-transmitting indium tin oxide (ITO), ITSO including an indium tin oxide and silicon oxide, organic indium, organotin, zinc oxide, titanium nitride or the like may be combined.

The n-type semiconductor film 213 is etched by using the source and drain wiring 214 as a mask to form n-type semiconductor films 215 and 216 for forming a source and drain region (FIG. 5B). Either plasma etching or wet etching may be applied for the etching step. Plasma etching is suitable for processing a large-sized substrate. A etching gas which is at least one selected from the group of $CF_4$, $NF_3$ and the like as a fluorine-based gas and $Cl_2$, $BCl_3$ and the like as a chlorine-based gas is used, and any one of He, Ar and the like may be added appropriately. In addition, when an etching step of atmospheric pressure discharging is applied, a local discharging process is also possible. Thereafter, a passivation layer 217 made of silicon nitride or silicon oxynitride is formed over the entire surface.

Figure 6:
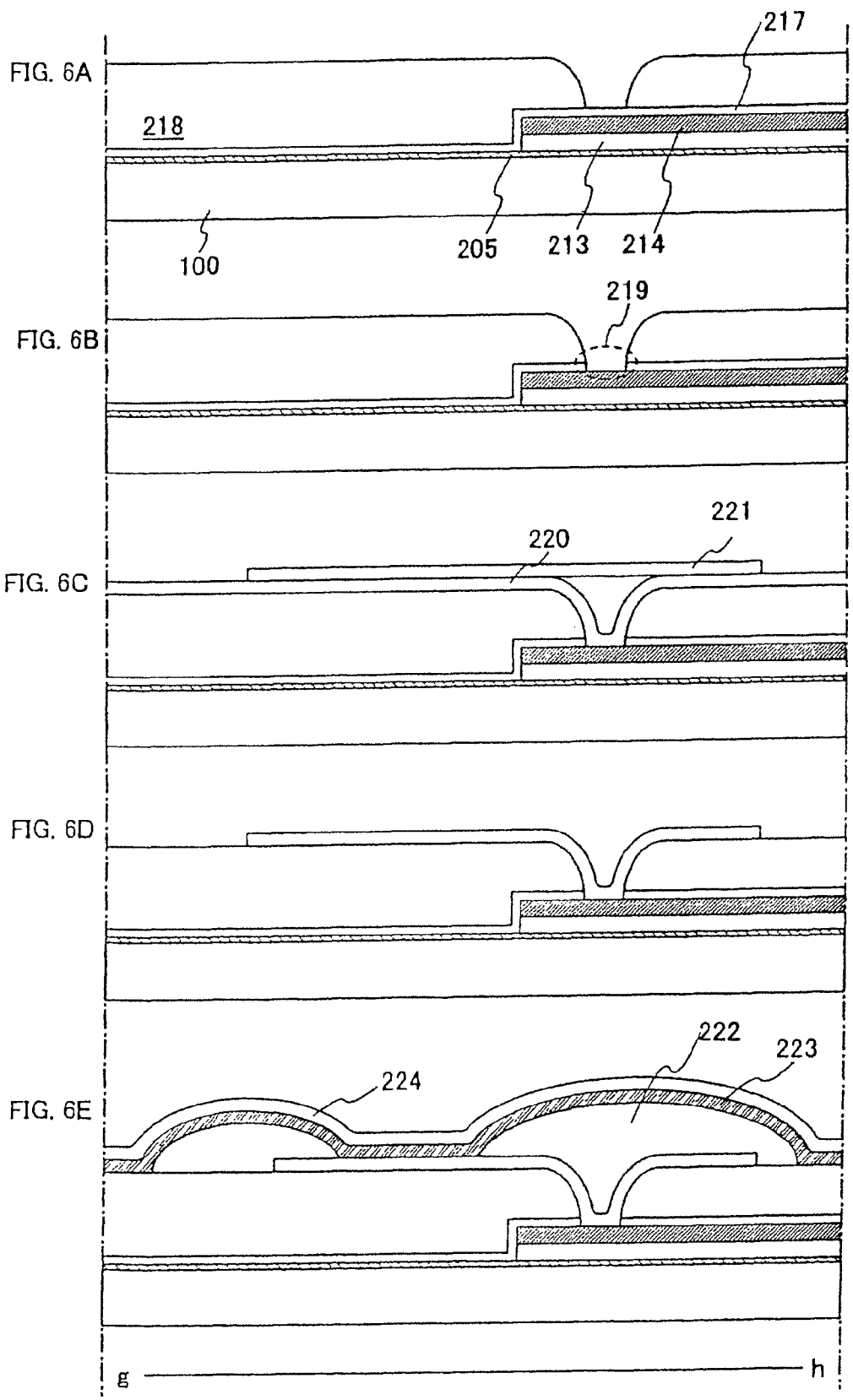
FIGS. 6A to 6E are cross-sectional views each showing a manufacturing step of an EL display panel according to one aspect of the present invention.

An interlayer film 218 is formed by a droplet discharging method in a whole region except a portion connecting electrically with the source and drain wiring 214 (FIG. 6A). Alternatively, the interlayer film 218 may be formed by a droplet discharging method in only a wiring portion except the portion connecting electrically with the source and drain wiring 214, as another method. This interlayer film is an insulating layer and can be formed from an inorganic insulating material such as silicon oxide, silicon nitride, silicon oxynitride, aluminum oxide, aluminum nitride, aluminum oxynitride, or the like; acrylic acid, methacrylic acid, and a derivative thereof; a heat-resistance high-polymer (high-molecular weight) material such as polyimide, aromatic polyamide, or polybenzimidazole; inorganic siloxane including a Si—O—Si bond, among the compounds made from silicon, oxygen and hydrogen, formed by using a siloxane-based material as a start material; or an organic siloxane insulating material in which hydrogen on silicon is substituted by an organic group such as methyl or phenyl. When the interlayer film 228 is formed from a photosensitive material or a non-photosensitive material such as acrylic or polyimide, it is preferable since the side face thereof has a shape in which a curvature radius changes continuously and a thin film in the upper layer is formed without break.

Next, a through-hole 219 is formed in a portion of the passivation layer 217 by an etching step using the interlayer film 218 as a mask, and the source and drain wiring 214 disposed in the lower layer thereof is partially exposed. Either plasma etching or wet etching may be applied for the etching step. Plasma etching is suitable for processing a large-sized substrate. A etching gas which is at least one selected from the group of $CF_4$, $NF_3$ and the like as a fluorine-based gas and $Cl_2$, $BCl_3$ and the like as a chlorine-based gas is used, and any one of He, Ar and the like may be added appropriately. In addition, when an etching step of atmospheric pressure discharging is applied, a local discharging process is also possible; therefore, there is no necessity to form a mask over an entire surface of a substrate.

Also, the interlayer film 218 is formed over a whole surface of the substrate by a spin-coating method or a dipping method, and then a through-hole 219 is formed by an etching step or the like. As the method for forming the through-hole 219, the following step may be employed. Initially, the whole surface of the substrate is coated with a coupling agent including fluorine such as fluoroalkylsilane, a liquid repellent organic material including fluorine such as $CHF_3$ or the like as a liquid repellent treatment, before forming the interlayer film 218. Then, a mask material is applied to a portion to form a through hole, and the liquid-repellent agent that is in a portion except in the portion provided with the mask is removed by $O_2$ ashing or the like. The mask is removed, and the interlayer film 218 is applied to the whole surface of the substrate by a spin-coating method, a dipping method or a droplet discharging method. Since the interlayer film 218 is not formed over the liquid-repellent portion, a through-hole 219 is formed by the formed interlayer film 218 as a mask. When the liquid-repellent agent is applied selectively to only a portion for a through hole with a droplet discharging apparatus, steps of forming the mask, removing the liquid-repellent agent and removing the mask are not required.

A first electrode 220 is formed to be electrically connected to the source and drain wiring 214. The first electrode 220 is formed from indium tin oxide (ITO), indium tin oxide containing silicon oxide (ITSO), zinc oxide (ZnO), or the like by a sputtering method. More preferably, indium tin oxide containing silicon oxide is used with a sputtering method by using a target in which silicon oxide of 2 wt. % to 10 wt. % is contained in ITO. Moreover, an oxide conductive material containing silicon oxide and in which zinc oxide (ZnO) of 2 wt. % to 20 wt. % is mixed with indium oxide (hereinafter, also referred to as "IZO") may be used.

A mask 221 may be formed by discharging selectively a composition over the first electrode 220. A resin material such as an epoxy resin, an acrylic resin, a phenol resin, a novolac resin, a melamine resin, or a urethane resin is used for the mask 221. Also the mask 221 is formed with a droplet discharging method by using an organic material such as benzocyclobutene, parylene, flare, or light-transmitting polyimide; a compound material made from polymerization such as siloxane-based polymer; a composition material containing water-soluble homopolymer and water-soluble copolymer; or the like. And also, a commercial resist material containing a photosensitive agent may be used. For example, a typical positive type resist that a novolac; resin, naphthoquinone diazide compounds as a photosensitive agent and the like are dissolved or dispersed with a known solvent; and a negative type resist that a base resin, diphenylsilanediol, an asid generation agent and the like are dissolved or dispersed with a known solvent may be used. In using any one of materials, surface tension and viscosity are appropriately adjusted by adjusting a concentration of a solvent or adding a surface activator or the like.

The first electrode 220 is etched by using the mask 221, and then, the mask 221 is removed (FIG. 6D). Either plasma etching or wet etching may be applied for the etching step. Plasma etching is suitable for processing a large-sized substrate. A etching gas which is at least one selected from the group of $CF_4$, $NF_3$ and the like as a fluorine-based gas and $Cl_2$, $BCl_3$ and the like as a chlorine-based gas is used, and any one of He, Ar and the like may be added appropriately. In addition, when an etching step of atmospheric pressure discharging is applied, a local discharging process is also possible.

The first electrode 220 may be formed by selectively discharging a composition containing a conductive material to electrically connect with the source and drain wiring 214 by a droplet discharging method. The first electrode 220, serves as a pixel electrode. In the case of manufacturing a transmission type EL display panel, a composition containing indium tin oxide (ITO), indium tin oxide containing silicon oxide (ITSO), zinc oxide (ZnO), tin oxide ($SnO_2$), or the like may be used for the first electrode 220. Then, a predetermined pattern may be formed from such a composition and a pixel electrode may be formed by baking. On the other hand, in the case of a structure in which generated light is emitted to the opposite side of the substrate 100, that is, a reflective EL display panel, a composition including mainly a metal particle such as Ag (silver), Au (gold), Cu (copper) W (tungsten), or Al (aluminum) can be used.

An insulating layer 222 is formed by a droplet discharging method to cover the edge of the etched first electrode. This insulating layer 222 can be formed from an inorganic insulating material such as silicon oxide, silicon nitride, silicon oxynitride, aluminum oxide, aluminum nitride, aluminum oxynitride; acrylic acid, methacrylic acid, and a derivative thereof; a heat-resistance high-polymer (high-molecular weight) material such as polyimide, aromatic polyamide, or polybenzimidazole; inorganic siloxane including a Si—O—Si bond, among the compounds made from silicon, oxygen, and hydrogen, formed by using a siloxane-based material as a start material; or an organic siloxane insulating material in which hydrogen on silicon is substituted by an organic group such as methyl or phenyl. When the insulating layer 222 is formed from a photosensitive material or a non-photosensitive material such as acrylic or polyimide, it is preferable since the edge thereof has a shape in which a curvature radius changes continuously and a thin film in the upper layer is formed without break. Further, as for the insulating layer 222, the insulating layer can be formed entirely by a spin-coating method or a dipping method, and a pattern can be formed by an etching step.

Through the above-mentioned steps, a TFT substrate for an EL display panel in which a bottom gate type (also referred to as a reverse stagger type) TFT and the first electrode are connected over the substrate 100 is completed.

Before forming an EL layer 223, a heat treatment at 200° C. at the atmospheric pressure is carried out to remove the moisture adsorbed in the insulating layer 222 or on the surface thereof. In addition, a heat treatment is carried out at temperatures from 200° C. to 400° C., preferably from 250° C. to 350° C. under low pressure. It is preferable to form the EL layer 223 by a vacuum evaporation method or a droplet discharging method under the low pressure without exposing to the air.

In addition, surface treatment may be additionally carried out by exposing the surface of the first electrode 220 to oxygen plasma or irradiating it with ultraviolet light. A second electrode 224 is formed on the EL layer 223 to form a light-emitting element by a sputtering method or a droplet discharging method. This light-emitting element has a structure in which it is connected to the driving TFT 10000.

Subsequently, a sealant is formed over the substrate and the EL layer over the substrate is sealed by using the sealing substrate. Thereafter, a flexible wiring board may be connected to the gate wiring. The same applies to a signal wiring.

As mentioned above, in this embodiment mode, steps can be omitted since a light-exposure step using a photomask is not employed. In addition, an EL display panel can be easily manufactured even when using a glass substrate of the fifth generation or later, in which one side of 1000 mm or more, by forming various kinds of pattern directly on a substrate by a droplet discharging method.

Embodiment Mode 2

A method for manufacturing a channel etch type TFT is explained in Embodiment mode 2.

A base film 201 is formed on a substrate 100, and a gate wiring 202, gate electrodes 203 and 204 are formed over the base film 201 by discharging a composition including a conductive material. After the gate wiring 202, the gate electrodes 203 and 204 are formed, the exposed base film 201 in the surface is treated and insulated to form an insulating layer 205 or removed by etching using the gate wiring 202, the gate electrodes 203 and 204 as a mask. Then, a gate insulating layer 206 is formed by plasma CVD or sputtering to have a single layer structure or a laminated layer structure. More preferably, a lamination of three layers, an insulating layer 207 of silicon nitride, an insulating layer 208 of silicon oxide and an insulating layer 209 of silicon nitride serves as the gate insulating layer. Further, a semiconductor film 210 serving as an active layer is formed. A mask 211 is formed by discharging selectively a composition in a portion corresponding to the gate electrodes 203 and 204, and the gate insulating layer 206 and the semiconductor film 210 are etched by using the mask 211 over the semiconductor film 210. After that, the mask 211 is removed. The above-mentioned steps are similar to those of Embodiment mode 1.

Figure 7:
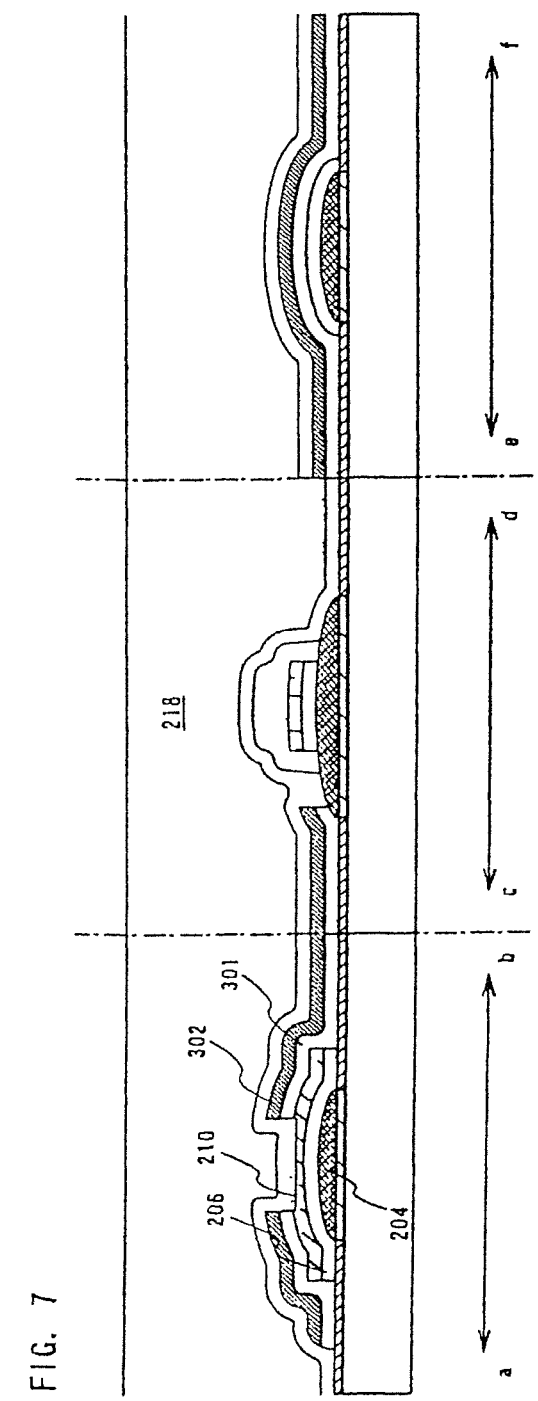
FIG. 7 is a cross-sectional view showing a manufacturing step of an EL display panel according to one aspect of the present invention.

An n-type semiconductor film 301 is formed over the semiconductor film 210. Then, a source and drain wiring 302 is formed by discharging a composition including a conductive material selectively by a droplet discharging method over the semiconductor film 301. Next, the n-type semiconductor film 301 is etched by the source and drain wiring 302 as a mask to form an n-type semiconductor film forming a source and drain region (FIG. 7). The etching step may employ plasma etching or wet etching, but plasma etching is more suitable for a large size substrate. A etching gas which is at least one selected from the group of $CF_4$, $NF_3$ and the like as a fluorine-based gas and $Cl_2$, $BCl_3$ and the like as a chlorine-based gas is used, and any one of He, Ar and the like may be added appropriately. If etching step with atmospheric pressure discharging is applied, local discharging process is also possible.

Subsequent steps are similar to those of Embodiment mode 1.

Embodiment Mode 3

A method for manufacturing a channel protective type TFT in which a first electrode is formed over a base film is explained in Embodiment mode 3.

Figure 13:
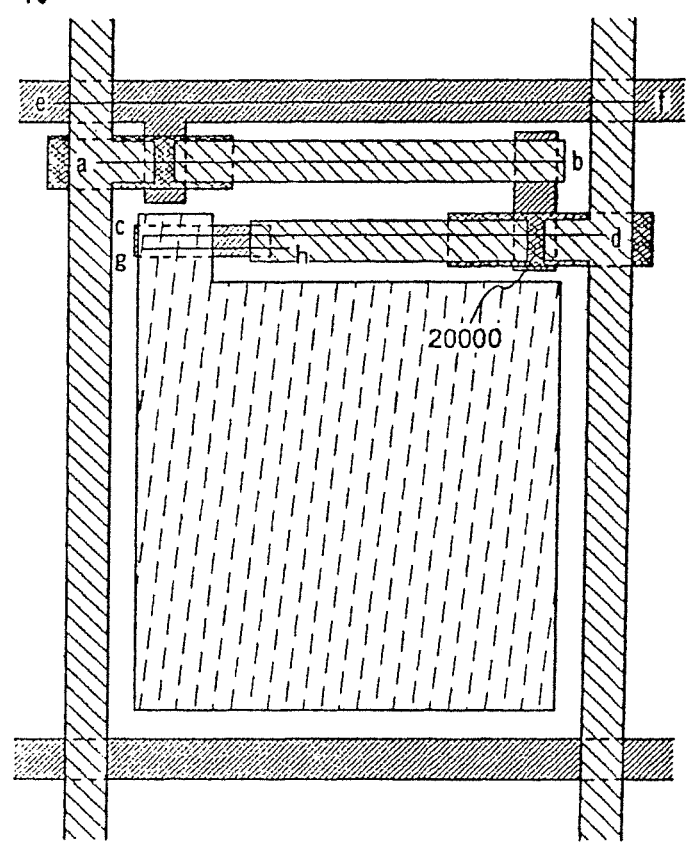
FIG. 13 is a top view showing a manufacturing step of an EL display panel according to one aspect of the present invention.

FIG. 9A shows a step of forming a first electrode over a substrate 100, and FIG. 9B shows a step of forming a gate electrode, and a gate wiring connected to the gate electrode by a droplet discharging method. Note that FIG. 9A shows schematically a longitudinal sectional structure, and FIG. 13 shows a planar structure corresponding to a-b, c-d and e-f thereof, and thus, the figures can be referred to at the same time.

A plastic substrate having the heat resistance that can withstand processing temperature of the manufacturing step or the like can be used for the substrate 100, in addition to a non-alkaline glass substrate such as barium borosilicate glass, alumino borosilicate glass, or aluminosilicate glass manufactured by a fusion method or a floating method, and a ceramic substrate. In addition, a semiconductor substrate such as single crystal silicon, a substrate in which a surface of a metal substrate such as stainless is provided with an insulating layer may be applied too.

A base film 401 formed from a metal material such as Ti (titanium), W (tungsten), Cr (chromium), Ta (tantalum), Ni (nickel), or Mo (molybdenum), an oxide thereof, a photocatalyst or the like is preferably formed on the substrate 100 by a sputtering method, a vapor deposition method or a droplet discharging method. The base film 401 may be formed to have a film thickness of 0.01 nm to 10 nm; however, a layer structure is not necessarily needed since it may be formed extremely thin. Note that this base film 401 is provided to form the gate electrode with good adhesiveness. When adequate adhesiveness is obtained, the electrode may be directly formed on the substrate 100 by a droplet discharging method without forming the base film 401. Alternatively, an atmospheric pressure plasma treatment may be conducted. Further, without limiting to this step, a similar treatment may be conducted so as to enhance adhesiveness with a conductive layer, in the case of forming the conductive layer over an organic layer, an inorganic layer or a metal layer by a droplet discharging method, or forming an organic layer, an inorganic layer or a metal layer over the conductive layer formed by a droplet discharging method, without limiting to the step.

A first electrode 402 is formed over the base film 401. The first electrode 402 is formed from indium tin oxide (ITO), indium tin oxide containing silicon oxide (ITSO), zinc oxide (ZnO), or the like by a sputtering method. More preferably, indium tin oxide containing silicon oxide is used with a sputtering method by using a target in which silicon oxide of 2 wt. % to 10 wt. % is contained in ITO. Moreover, an oxide conductive material which contains silicon oxide and in which zinc oxide (ZnO) of 2 wt. % to 20 wt. % is mixed with indium oxide may be used.

A mask 403 is formed by discharging selectively a composition over the first electrode 402. A resin material which is one selected from a group of an epoxy resin, an acrylic resin, a phenol resin, a novolac resin, a melamine resin and a urethane resin may be used for the mask 403. Also the mask may be formed by a droplet discharging method by using an organic material such as benzocyclobutene, parylene, flare or light-transmitting polyimide; a compound material made from polymerization such as siloxane-based polymer; a composition material containing water-soluble homopolymer and water-soluble copolymer; or the like. Alternatively, a commercial resist material containing a photosensitive agent may be used. For example, a typical positive type resist that a novolac resin, naphthoquinone diazide compounds as a photosensitive agent and the like are dissolved or dispersed with a known solvent; and a negative type resist that a base resin, diphenylsilanediol, an asid generation agent and the like are dissolved or dispersed with a known solvent may be used. In using any one of materials, surface tension and viscosity are appropriately adjusted by adjusting a concentration of a solvent or adding a surface activator or the like.

The first electrode 402 is etched by using the mask 403, and then, the mask 403 is removed (FIG. 9A). Either plasma etching or wet etching may be applied for the etching step. Plasma etching is suitable for processing a large-sized substrate. A etching gas which is at least one selected from the group of $CF_4$, $NF_3$ and the like as a fluorine-based gas and $Cl_2$, $BCl_3$ and the like as a chlorine-based gas is used, and any one of He, Ar and the like may be added appropriately. In addition, when an etching step of atmospheric pressure discharging is applied, a local discharging process is also possible.

The first electrode 402 may be formed by selectively discharging a composition containing a conductive material by a droplet discharging method. In the case of manufacturing a transmission type EL display panel, a composition containing indium tin oxide (ITO), indium tin oxide containing silicon oxide (ITSO), zinc oxide (ZnO), tin oxide ($SnO_2$), or the like may be used for the first electrode 402. Then, a predetermined pattern may be formed by using such a composition and a pixel electrode may be formed by baking. On the other hand, in the case of a structure in which generated light is emitted to the opposite side of the substrate 100, that is, a reflective EL display panel, a composition including mainly a metal particle such as Ag (silver), Au (gold), Cu (copper) W (tungsten), or Al (aluminum) can be used.

Gate wirings 404 and 407, and gate electrodes 405 and 406 are formed by discharging a composition containing a conductive material by a droplet discharging method. The composition containing particles of a metal such as Ag (silver), Au (gold), Cu (copper), W (tungsten), or Al (aluminum) as the main component can be used as the conductive material for forming these layers. Specifically, the gate wiring is preferable to be low resistance. Therefore, a solution in which any one of gold, silver, and copper dissolved or dispersed in a solvent is preferably used, and more preferably silver or copper with low resistance is used in consideration of a specific resistance value. Alternatively, a lamination of silver and copper may be used. Silver that has been applied very thinly may be plated with copper to be a thicker wiring, since silver is so expensive. The surface of the applied silver is rough and easy to be plated. As the plating method, there is a method of dipping in a plating solution or flowing a plating solution. When silver and copper are used, a barrier layer may be provided additionally as a measure against impurities. Nickel boron (NIB) may be used for the barrier layer as well as a silicon nitride film. The surface can be smoothed by nickel boron. A solvent corresponds to ester such as butyl acetate, alcohols such as isopropyl alcohol, an organic solvent such as acetone, or the like. Surface tension and viscosity are appropriately adjusted by adjusting a concentration of a solvent and adding a surface activator.

A diameter of a nozzle used in a droplet discharging method is set to be from 0.02 μm to 100 μm (preferably, 30 μm or less), and a discharging amount of a composition discharged from the nozzle is preferably set to be from 0.001 pl to 100 pl (more preferably, 10 pl or less). There are two types of an on-demand type and a continuous type for a droplet discharging method, either of which may be used. Furthermore, there is a piezoelectric system using properties of transforming by applying voltage to a piezoelectric material and a heating system that boils a composition by a heater provided in a nozzle and discharges the composition for a nozzle to be used in a droplet discharging method, either of which may be used. A distance between an object and a discharging outlet of a nozzle is preferable to be made as close as possible to drop a droplet at a desired place, which is preferably set to be from 0.1 mm to 3 mm (more preferably, 1 mm or less). While keeping the relative distance, either the nozzle or the object moves and thus, a desired pattern is drawn. A plasma treatment may be carried out on a surface of the object before discharging a composition. This is because an advantage that a surface of the subject becomes hydrophilic and lyophobic when the plasma treatment is carried out, can be obtained. For example, it becomes hydrophilic to purified water and it becomes lyophobic to a paste dissolved with alcohol.

The step of discharging a composition may be performed under low pressure. This is because a solvent of the composition is volatilized until the composition is attached onto an object since it is discharged. Thus, steps of baking and drying later can be omitted or performed with a shorter time. After discharging the composition, either or both steps of drying and baking is/are carried out by irradiation of laser light, rapid thermal annealing, heating furnace, or the like under atmospheric pressure or low pressure. Both the steps of drying and baking are steps of heat treatment. For example, drying is carried out at 100° C. for 3 minutes and baking is carried out at temperatures from 200° C. to 350° C. for 15 to 120 minutes. The steps of baking and drying have each different object, and need each different temperature, and time. In order to carry out the steps of drying and baking favorably, a substrate may be heated, of which temperatures are set to be from 100° C. to 800° C. (preferably, temperatures from 200° C. to 350° C.), depending on a material of a substrate or the like. Through this step, a solvent in a composition is volatilized or dispersant is removed chemically, and the resin in the periphery cures and shrinks, thereby accelerating fusion and welding. It is carried out under an oxygen atmosphere, a nitrogen atmosphere, or the air. However, this step is preferable to be carried out under an oxygen atmosphere in which a solvent decomposing or dispersing a metal element is easily removed.

A continuous-wave or pulsed gas laser or solid state laser may be used for irradiation with laser light. There is an excimer laser, or the like as the gas laser, and there is a laser using a crystal such as YAG or YVO$_4$ doped with Cr, Nd, or the like as the solid state laser. It is preferable to use a continuous-wave laser in terms of the laser light absorptance. In addition, a so-called hybrid method of laser irradiation combining a continuous oscillation and a pulsed oscillation may be also used. However, a heat treatment by irradiation of laser light may be carried out rapidly for several microseconds to several tens of seconds, based on the heat resistance of a substrate. Rapid Thermal Annealing (RTA) is carried out by applying heat rapidly for several microseconds to several minutes by rapidly raising temperature by using a halogen lamp, an infrared lamp that emits light from ultraviolet light to infrared light, or the like under an atmosphere of an inert gas. This treatment is carried out rapidly; therefore, substantially, only a thin film of an uppermost surface can be heated, and thus, there is advantage that the lower layer is not affected.

After forming the gate wirings 404 and 407, and the gate electrodes 405 and 406, it is desirable to carry out one of the following two steps as a treatment of the base film 201 that is exposed in the surface.

A first method is a step of forming an insulating layer 408 by insulating the base film 401 not overlapping with the first electrode 402, the gate wirings 404 and 407 and the gate electrodes 405 and 406 (FIG. 9B). In other words, the base film 401 not overlapping with the first electrode 402, the gate wirings 404 and 407 and the gate electrodes 405 and 406 are oxidized and insulated. In the case of insulating the base film 401 by oxidizing in this manner, the base film 401 is preferably formed to have a film thickness of from 0.01 nm to 10 nm, so that it can be easily oxidized. Note that either a method of exposing to an oxygen atmosphere or a heat treatment may be used as the oxidizing method.

A second method is a step of etching and removing the base film 401, using the first electrode 402, the gate wirings 404 and 407 and the gate electrodes 405 and 406 as a mask. In the case of using this step, there is no restriction on a film thickness of the base film 401.

Next, a gate insulating layer 409 is formed in a single layer structure or a laminated structure by using a plasma CVD method or a sputtering method (FIG. 9C). As a specifically preferable mode, a lamination body of three layers of an insulating layer 410 made from silicon nitride, an insulating layer 411 made from silicon oxide, and an insulating layer 412 made from silicon nitride is formed as the gate insulating layer. Note that a rare gas such as argon may be contained in a reactive gas and mixed into an insulating layer to be formed in order to form a dense insulating layer with little gate leak current at a low deposition temperature. Deterioration by oxidation can be prevented by forming a first layer to be in contact with the gate wirings 404 and 407, and the gate electrodes 405 and 406 from silicon nitride or silicon oxynitride. Nickel boron (NiB) is used for the first layer to be in contact with the gate wirings 404 and 407, and the gate electrodes 405 and 406. Thus, the surface can be smoothed.

Next, a semiconductor film 413 is formed. The semiconductor film 413 is formed from an AS or SAS manufactured with a vapor phase growth method by using a semiconductor material gas typified by silane or germane or a sputtering method. A plasma CVD method or a thermal CVD method can be used as the vapor phase growth method.

In the case of using a plasma CVD method, an AS is formed from SiH$_4$ which is a semiconductor material gas or a mixed gas of SiH$_4$ and H$_2$. When SiH$_4$ is diluted with H$_2$ 3 times to 1000 times to make a mixed gas or when Si$_2$H$_6$ is diluted with GeF$_4$ so that a gas flow rate of Si$_2$H$_6$:GeF$_4$ is from 20 to 40:0.9, an SAS of which Si composition ratio is 80% or more can be obtained. Specifically, the latter case is preferable since the semiconductor film 413 can have crystallinity from an interface with the base.

A mask 414 is formed at a position corresponding to the gate electrodes 405 and 406 by discharging selectively a composition over the semiconductor film 413. A resin material such as an epoxy resin, an acrylic resin, a phenol resin, a novolac resin, a melamine resin, or a urethane resin is used for the mask 414. In addition, the mask 414 is formed by a droplet discharging method by using an organic material such as benzocyclobutene, parylene, flare, or light-transmitting polyimide; a compound material made from polymerization such as siloxane-based polymer; a composition material containing water-soluble homopolymer and water-soluble copolymer; or the like. Alternatively, a commercial resist material containing a photosensitive agent may be used. For example, a typical positive type resist that a novolac resin, naphthoquinone diazide compounds as a photosensitive agent and the like are dissolved or dispersed with a known solvent; and a negative type resist that a base resin, diphenylsilanediol, an acid generation agent and the like are dissolved or dispersed with a known solvent may be used. In using any one of the materials, surface tension and viscosity are appropriately adjusted by adjusting a concentration of a solvent or adding a surface activator or the like.

The insulating layer 409 and the semiconductor film 413 are etched by using the mask 414 (FIG. 9D). Either plasma etching or wet etching may be applied for the etching step. Plasma etching is suitable for processing a large-sized substrate. A etching gas which is at least one selected from the group of CF$_4$, NF$_3$ and the like as a fluorine-based gas and Cl$_2$, BCl$_3$ and the like as a chlorine-based gas is used, and any one of He, Ar and the like may be added appropriately. In addition, when an etching step of atmospheric pressure discharging is applied, a local discharging process is also possible. Then, the mask 414 is removed, and a protective layer 415 is formed by a droplet discharging method over the semiconductor film 413. The protective layer has functions of ensuring cleanness at the interface and preventing the semiconductor film 413 from being contaminated by impurities such as an organic material, a metal, and water vapor. The protective layer also has a function as an interlayer film.

Next, an n-type semiconductor film 416 is formed. The n-type semiconductor film 416 may be formed by using a silane gas and a phosphine gas, and can be formed with AS or SAS. A composition including conductive material is discharged selectively to form a source and drain wiring 417 by a droplet discharging method (FIG. 10B). As the conductive material for forming the wiring, a composition mainly containing a metal particle such as Ag (silver), Au (gold), Cu (copper), W (tungsten), or Al (aluminum) can be used. A lamination of silver and copper or the like may be used. A light-transmitting indium tin oxide (ITO), ITSO including an indium tin oxide and silicon oxide, organic indium, organotin, zinc oxide, titanium nitride or the like may be combined.

The n-type semiconductor film 416 is etched by using the source and drain wiring 417 as a mask to form n-type semiconductor films 418 and 419 for forming a source and drain region (FIG. 10C). Thereafter, a passivation layer 420 made of silicon nitride or silicon oxynitride is formed over the entire surface.

Figure 11A:
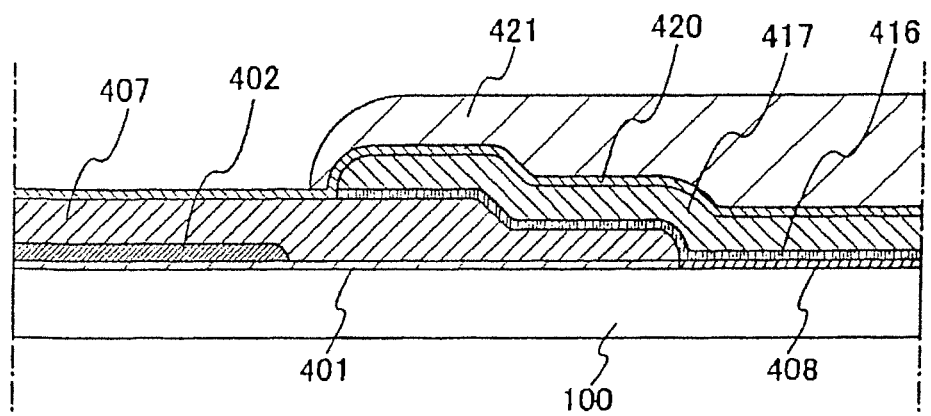
FIGS. 11A and 11B are cross-sectional views each showing a manufacturing step of an EL display panel according to one aspect of the present invention.

An interlayer film 421 is formed by a droplet discharging method in a whole region except a light-emitting region (FIG. 11A). This interlayer film is an insulating layer and can be formed from an inorganic insulating material such as silicon oxide, silicon nitride, silicon oxynitride, aluminum oxide, aluminum nitride, aluminum oxynitride; acrylic acid, methacrylic acid, and a derivative thereof; a heat-resistance high-polymer (high-molecular weight) material such as polyimide, aromatic polyamide, or polybenzimidazole; inorganic siloxane including a Si—O—Si bond, among the compounds made from silicon, oxygen and hydrogen, formed by using a siloxane-based material as a start material; or an organic siloxane insulating material in which hydrogen on silicon is substituted by an organic group such as methyl or phenyl. When the interlayer film is formed from a material such as photosensitive acrylic or photosensitive polyimide, it is preferable since the side face thereof has a shape in which a curvature radius changes continuously and a thin film in the upper layer is formed without break.

The passivation layer 420 in the light emitting region is etched by the interlayer film 421 as a mask. Either plasma etching or wet etching may be applied for the etching step. Plasma etching is suitable for processing a large-sized substrate. A etching gas which is at least one selected from the group of $CF_4$, $NF_3$ and the like as a fluorine-based gas and $Cl_2$, $BCl_3$ and the like as a chlorine-based gas is used, and any one of He, Ar and the like may be added appropriately. In addition, when an etching step of atmospheric pressure discharging is applied, a local discharging process is also possible; therefore, there is no necessity to form a mask over an entire surface of a substrate.

Through the above-mentioned steps, a TFT substrate for an EL display panel in which a bottom gate type (also referred to as a reverse stagger type) TFT and the first electrode are connected over the substrate 100 is completed.

Before forming an EL layer 422, a heat treatment at 200° C. in the atmospheric pressure is carried out to remove the moisture adsorbed in the insulating layer 421 or on the surface thereof. In addition, a heat treatment is carried out at temperatures from 200° C. to 400° C., preferably from 250° C. to 350° C. under low pressure. It is preferable to form the EL layer 422 by a vacuum evaporation method or a droplet discharging method under the low pressure without exposing to the air.

Figure 11B:
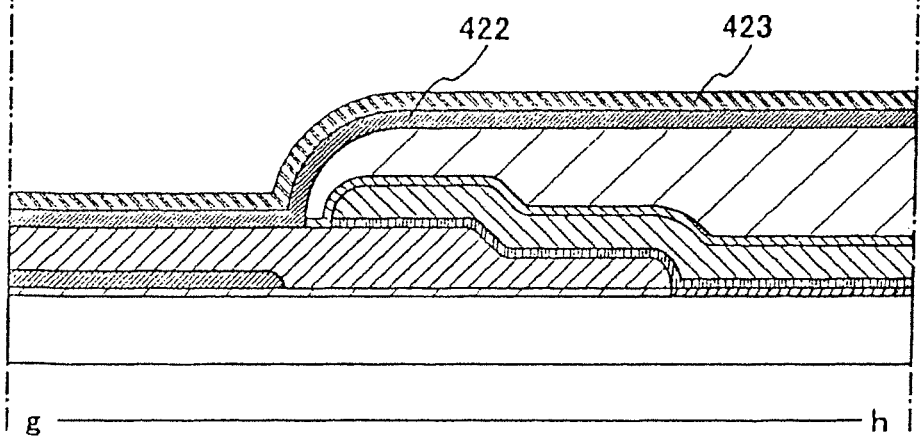

In addition, a surface treatment may be additionally carried out by exposing the surface of the first electrode 402 to oxygen plasma or irradiating it with ultraviolet light. A second electrode 423 is formed on the EL layer 422 to form a light-emitting element by a sputtering method or a droplet discharging method. This light-emitting element has a structure in which it is connected to the driving TFT 20000 (FIG. 11B).

Subsequently, a sealant is formed over the substrate and the EL layer over the substrate is sealed by using a sealing substrate. Thereafter, a flexible wiring board may be connected to the gate wiring. The same applies to a signal wiring.

As mentioned above, in this embodiment mode, steps can be omitted since a light-exposure step using a photomask is not employed. In addition, an EL display panel can be easily manufactured even when using a glass substrate of the fifth generation or later, in which one side of 1000 mm or more, by forming various kinds of pattern directly on a substrate by a droplet discharging method.

Embodiment Mode 4

A method for manufacturing a channel etch type TFT in which a first electrode is formed over a base film is described in Embodiment mode 4.

A base film 401 is formed on a substrate 100, and a first electrode 402 is formed on the base film 401. Then, a mask 403 is formed by discharging a composition selectively over the first electrode 402. The first electrode 402 is etched by using the mask 403, and then, the mask 403 is removed. Next, gate wirings 404 and 407, and gate electrodes 405 and 406 are formed by discharging a composition including a conductive material. After that, the exposed base film 401 in the surface is treated and insulated to form an insulating layer 408, or the base film 401 is etched and removed by using the first electrode 402, the gate wirings 404 and 407, and the gate electrodes 405 and 406 as a mask. Then, a gate insulating layer 409 is formed by plasma CVD or sputtering to have a single layer structure or a laminated layer structure. More preferably, a lamination of three layers, an insulating layer 410 of silicon nitride, an insulating layer 411 of silicon oxide and an insulating layer 412 of silicon nitride serves as the gate insulating layer. Further, a semiconductor film 413 serving as an active layer is formed. A mask 414 is formed by discharging selectively a composition in a portion corresponding to the gate electrodes 405 and 406 over the semiconductor film 413, and the gate insulating layer 409 and the semiconductor film 413 are etched by using the mask 414. After that, the mask 414 is removed. The above-mentioned steps are similar to those of Embodiment mode 3.

Figure 12:
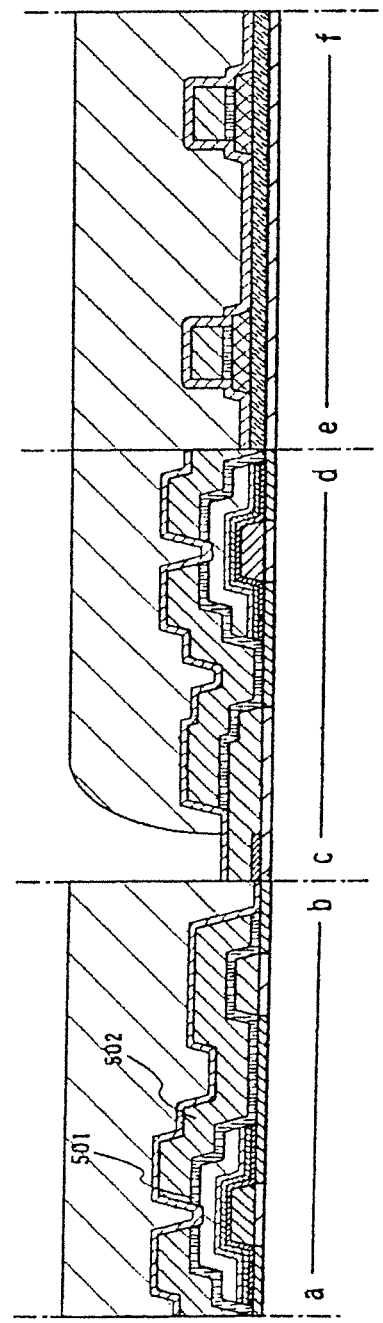
FIG. 12 is a cross-sectional view showing a manufacturing step of an EL display panel according to one aspect of the present invention.

An n-type semiconductor film 501 is formed over the semiconductor film 413. Then, a source and drain wiring 502 is formed by discharging a composition including a conductive material selectively by a droplet discharging method over the semiconductor film 501. Next, the n-type semiconductor film 501 is etched by the source and drain wiring 502 as a mask to form an n-type semiconductor film forming a source and drain region (FIG. 12).

Subsequent steps are similar to those of Embodiment mode 3.

Embodiment 1

In Embodiment modes 1 to 4, a capacitor can be also formed.

In the step of forming a gate wiring and a gate electrode, a capacitor electrode layer is formed by discharging a composition including a conductive material by a droplet discharging method.

On the capacitor electrode layer, a gate insulating layer and a semiconductor film are formed. Next, a mask is formed on the semiconductor film. The gate insulating layer and the semiconductor film are etched by using the mask, and then, the mask is removed. A capacitor can be formed by forming a wiring in a portion overlapping with the capacitor electrode layer. In other cases, it is possible that a capacitor is formed by leaving the gate insulating layer selectively in a portion to be provided with the capacitor.

Embodiment 2

In an EL display device manufactured according to any one of Embodiment modes 1 to 4, and Embodiment 1, a scanning line driver circuit can be formed on a substrate 100 by forming a semiconductor film with an SAS, as shown in FIG. 3.

Figure 22:
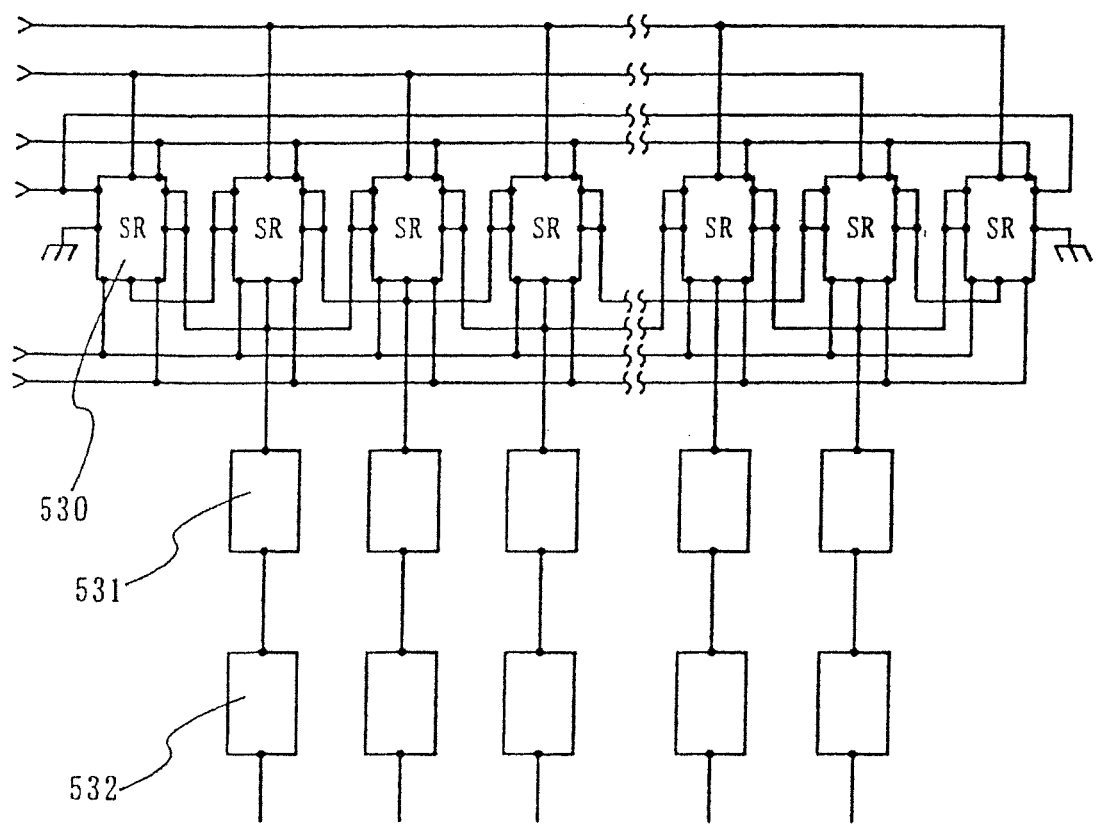
FIG. 22 shows a circuit configuration in the case of forming a scanning line driver circuit with a TFT in a liquid crystal display panel according to one aspect of the present invention.

FIG. 22 shows a block diagram of the scanning line driver circuit which comprises an n-channel TFT using the SAS that can obtain an electron field-effect mobility of 1 to 15 $cm^2/V \cdot sec$.

A block denoted by 530 in FIG. 22 corresponds to a pulse output circuit for outputting a sampling pulse for one stage and a shift register comprises n pulse output circuits. Reference numeral 531 denotes a buffer circuit and a pixel 532 (which corresponds to the pixel 102 in FIG. 3) is connected thereto.

Figure 23:
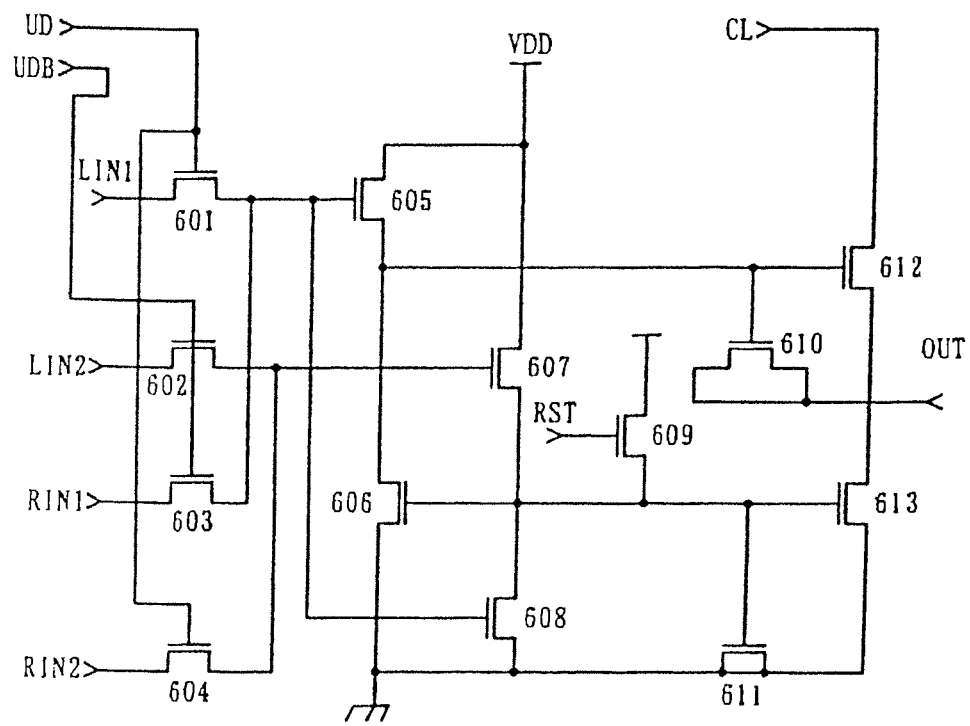
FIG. 23 shows a circuit configuration in the case of forming a scanning line driver circuit with a TFT in a liquid crystal display panel according to one aspect of the present invention (a shift register circuit)

FIG. 23 shows a concrete configuration of the pulse output circuit 530 which comprises n-channel TFTs 601 to 613. At the time, in consideration of an operating characteristic of the n-channel TFT using SAS, a size of the TFT may be determined. For example, when the channel length is set 8 μm, the channel width may be set in the range of 10 to 80 μm.

Figure 24:
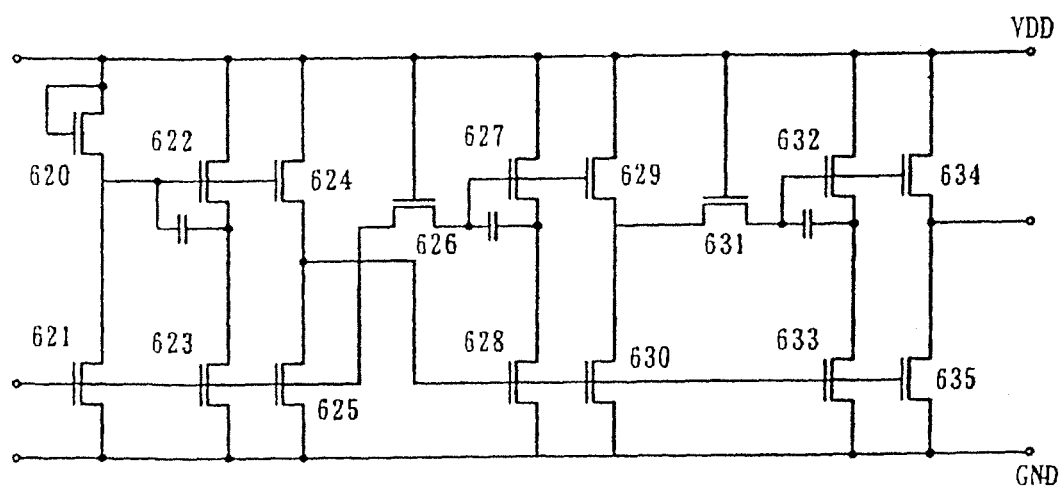
FIG. 24 shows a circuit configuration in the case of forming a scanning line driver circuit with a TFT in a liquid crystal display panel according to one aspect of the present invention (a buffer circuit)

FIG. 24 shows a concrete configuration of a buffer circuit 531 which also comprises n-channel TFT 620 to 635, similarly. At the time, in consideration of an operating characteristic of the n-channel TFT using SAS, a size of the TFT may be determined. For example, when the channel length is set 10 μm, the channel width may be set in the range of 10 to 1800 μm.

Figure 14:
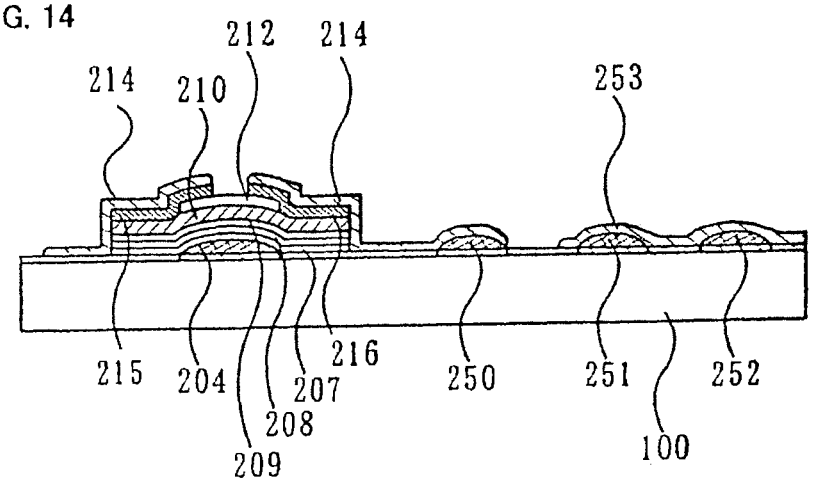
FIG. 14 is a cross-sectional view showing a manufacturing step of an EL display panel according to one aspect of the present invention.

It is necessary to connect respective TFTs by wirings to realize such a circuit. A configuration example of the wiring in that case is shown in FIG. 14. FIG. 14 shows a mode in which a gate electrode 204, a gate insulating layer 206 (a lamination of three layers of an insulating layer 207 of silicon nitride, an insulating layer 208 of silicon oxide, and an insulating layer 209 of silicon nitride), a semiconductor film 210 made of SAS, an insulating layer 212 forming a channel protective layer, n-type semiconductor films 215 and 216 forming a source and drain, and a source and drain wiring 214 are formed, as in Embodiment mode 1. In this case, connection wirings 250, 251, and 252 are formed over the substrate 100 in the same step of forming the gate electrode 204. A portion of the gate insulating layer is etched to expose the connection wirings 250, 251, and 252, and TFTs are connected appropriately by the source and drain wiring 214 and a connection wiring 253 that is formed in the same step of forming the source and drain wiring 214, thereby realizing various circuits.

Embodiment 3

A mode of a light-emitting element that is applicable to Embodiment modes 1 to 4 and Embodiments 1 and 2 is explained with reference to FIGS. 17A and 17B and FIGS. 18A and 18B.

Figure 17A:
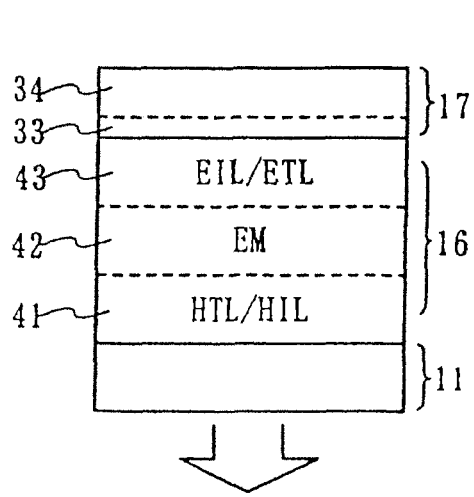
FIGS. 17A and 17B each show a mode of a light-emitting element which can be applied to the present invention.

FIG. 17A is an example in which a first electrode 11 is formed from a light-transmitting oxide conductive material. The light-transmitting oxide conductive material is preferable to be indium tin oxide containing silicon oxide of 1 atomic % to 15 atomic % in concentration. An EL layer 16 in which a hole injection layer or hole transporting layer 41, a light-emitting layer 42, and an electron transporting layer or electron injecting layer 43 are laminated is provided over the first electrode 11. A second electrode 17 is formed of a first electrode layer 33 comprising an alkaline metal or an alkaline earth metal, for example, LiF or MgAg and a second electrode layer 34 formed from a metal material such as aluminum. The pixel having such a structure can radiate light from the first electrode 11 side as shown by the arrow in the FIG. 17A.

Figure 17B:
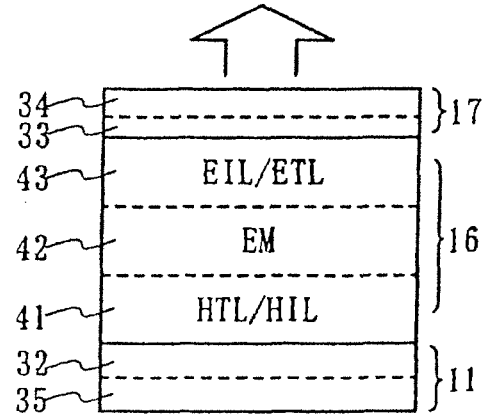

FIG. 17B shows an example of radiating light from the second electrode 17. A first electrode 11 is formed of a first electrode layer 35 comprising a metal such as aluminum or titanium or a metal material comprising the metal and nitrogen of stoichiometric composition ratio or less in its concentration and a second electrode layer 32 comprising a conductive oxide material containing 1 atomic % to 15 atomic % of silicon oxide in its concentration. An EL layer 16 in which a hole injecting layer or hole transporting layer 41, a light-emitting layer 42 and an electron transporting layer or electron injecting layer 43 are laminated is provided over the first electrode 11. A second electrode 17 is formed of a third electrode layer 33 comprising an alkaline metal or an alkaline earth metal, for example, LiF or CaF and a fourth electrode layer 34 comprising a metal material such as aluminum. However, each thickness of the layers is set to 100 nm or less to obtain a state in which light can be transmitted. Accordingly, it is possible to radiate light from the second electrode 17.

Figure 18A:
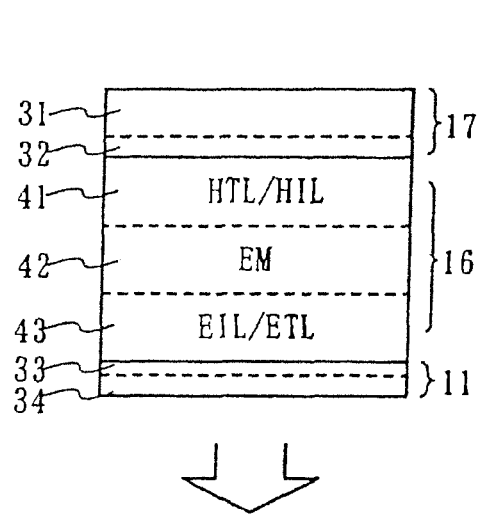
FIGS. 18A and 18B each show a mode of a light-emitting element which can be applied to the present invention.

FIG. 18A shows an example of radiating light from a first electrode 11 and shows a structure in which an electron transporting layer or electron injecting layer 43, a light-emitting layer 42, and a hole injecting layer or hole transporting layer 41 are sequentially laminated as an EL layer. From the EL layer 16 side, a second electrode 17 is formed of a second electrode layer 32 comprising an oxide conductive material containing silicon oxide of 1 atomic % to 15 atomic % in its concentration, and a first electrode layer 31 comprising a metal such as aluminum or titanium, or a metal material containing the metal and nitrogen of stoichiometric composition ratio or less in its concentration. The first electrode 11 is formed from a third electrode layer 33 comprising an alkaline metal or an alkaline earth metal, for example, LiF or CaF and a fourth electrode layer 34 comprising a metal material such as aluminum. However, each thickness of the layers is set to 100 nm or less to obtain a state in which light can be transmitted. Accordingly, it is possible to radiate light from the first electrode 11.

Figure 18B:
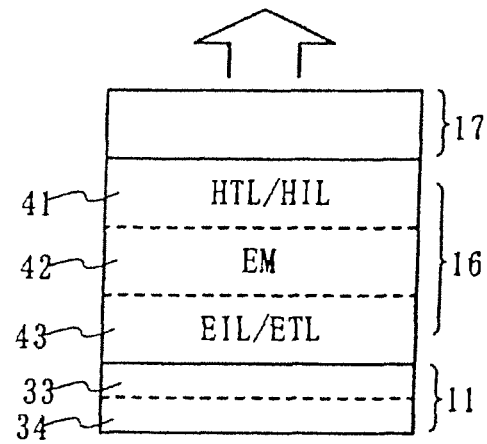

FIG. 18B shows an example of radiating light from a second electrode 17 and shows a structure in which an electron transporting layer or electron injecting layer 43, a light-emitting layer 42, and a hole injecting layer or hole transporting layer 41 are sequentially laminated as an EL layer. A first electrode 11 has the same structure as that of FIG. 15A and is formed to have a film thickness enough thick to reflect light generated in the EL layer. The second electrode 17 is formed from a conductive oxide material comprising silicon oxide of 1 atomic % to 15 atomic % in concentration. In this structure, the hole injecting layer 41 is formed from a metallic oxide which is an inorganic material (typically, molybdenum oxide or vanadium oxide). Accordingly, oxygen introduced in forming the second electrode 32 is supplied and thus, hole injection properties are improved; therefore, a driving voltage can be decreased.

The first electrode is formed from a light-transmitting oxide conductive material and the second electrode can transmit light or is formed from a light-transmitting oxide conductive material. At the time, light can be emitted (radiated) from opposite sides, in other words, from the first and second electrode sides.

Embodiment 4

Next, a mode of mounting a driver circuit for driving on an EL display panel manufactured according to any one of Embodiment modes 1 to 4, and Embodiment 1 is explained with reference to FIGS. 19A and 19B and FIGS. 20A and 20B.

Figure 19A:
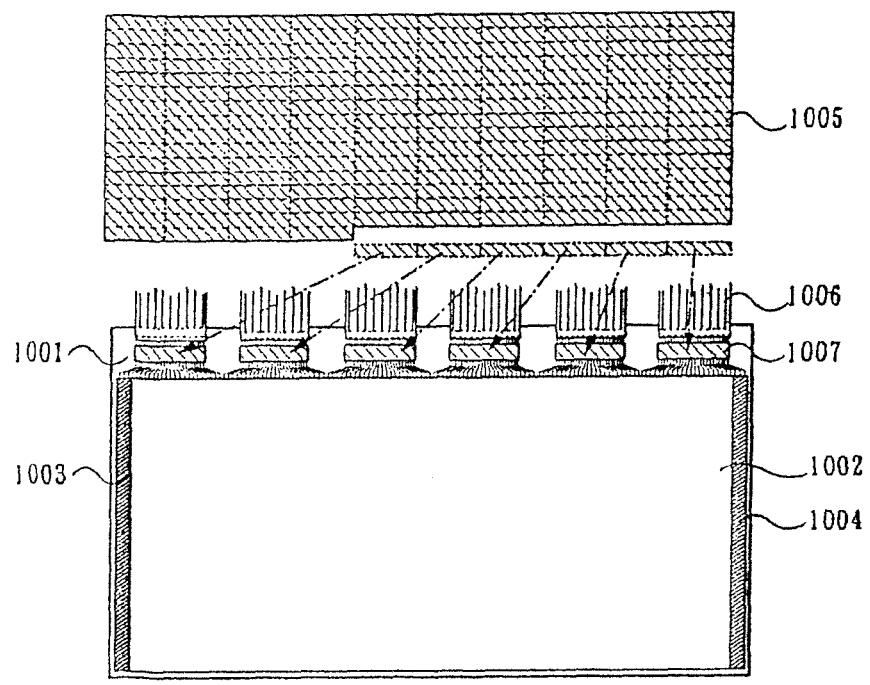
FIGS. 19A and 19B each show a mounting method of a driver circuit of an EL display panel according to one aspect of the present invention.
Figure 19B:
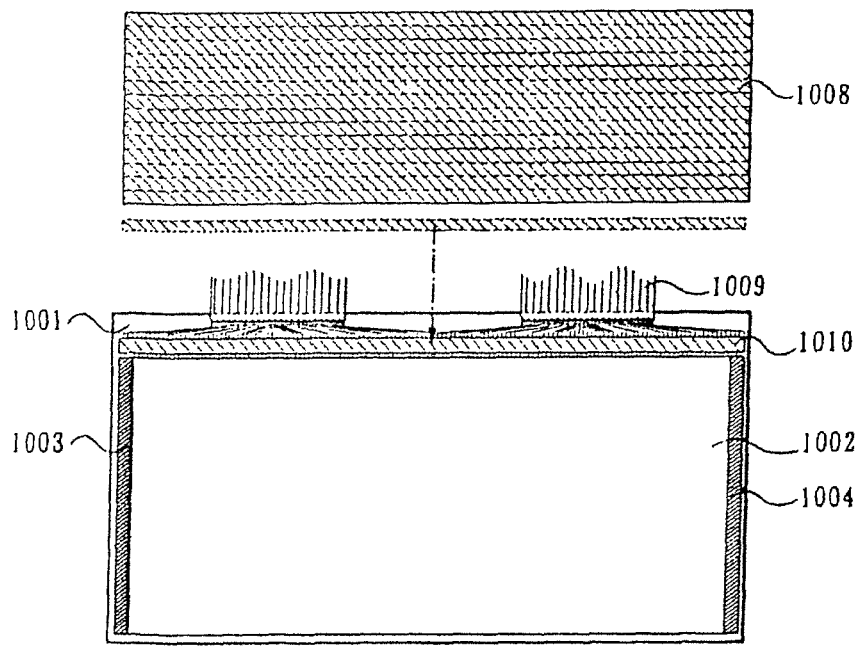

First, a display device to which a COG method is applied is explained with reference to FIGS. 19A and 19B. A pixel portion 1002 displaying information of a character, an image or the like and scanning line driver circuits 1003 and 1004 are provided on a substrate 1001. Substrates 1005 and 1008 where plural driver circuits are provided are sectioned to be rectangular, and the sectioned driver circuits (referred to as a driver IC, hereinafter) are mounted on the substrate 1001. FIG. 19A shows plural driver ICs 1007 and a mode of mounting a tape 1006 to an end of each driver ICs 1007. FIG. 19B shows a driver 1010 and a mode of mounting a tape 1009 to an end of each driver ICs 1010.

Figure 20A:
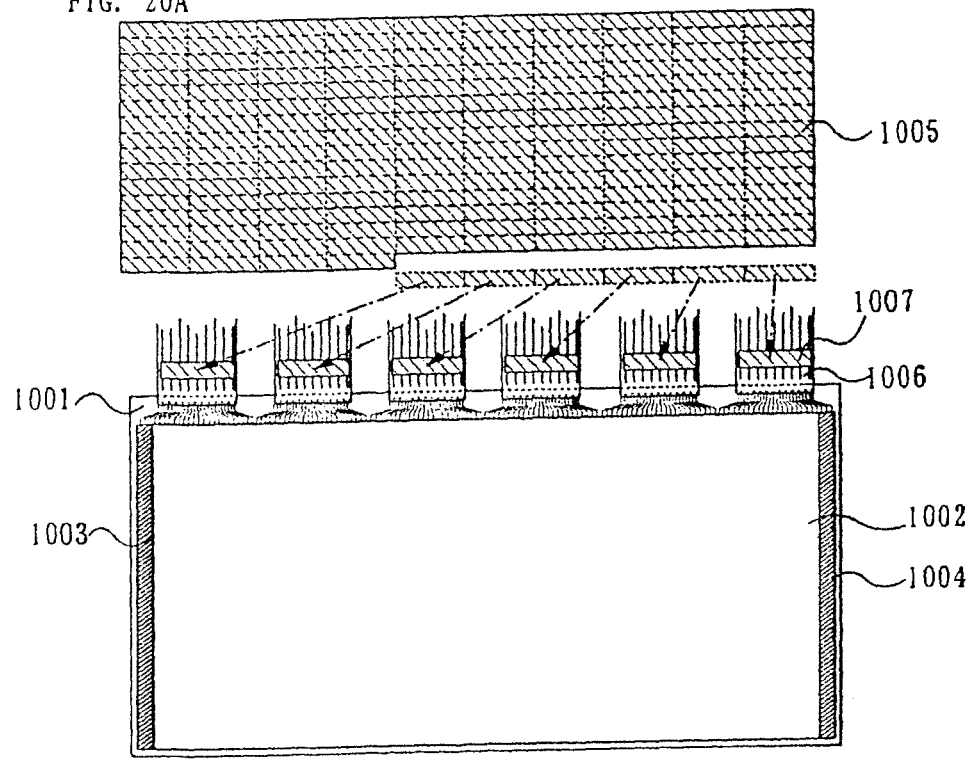
FIGS. 20A and 20B each show a mounting method of a driver circuit of an EL display panel according to one aspect of the present invention.
Figure 20B:
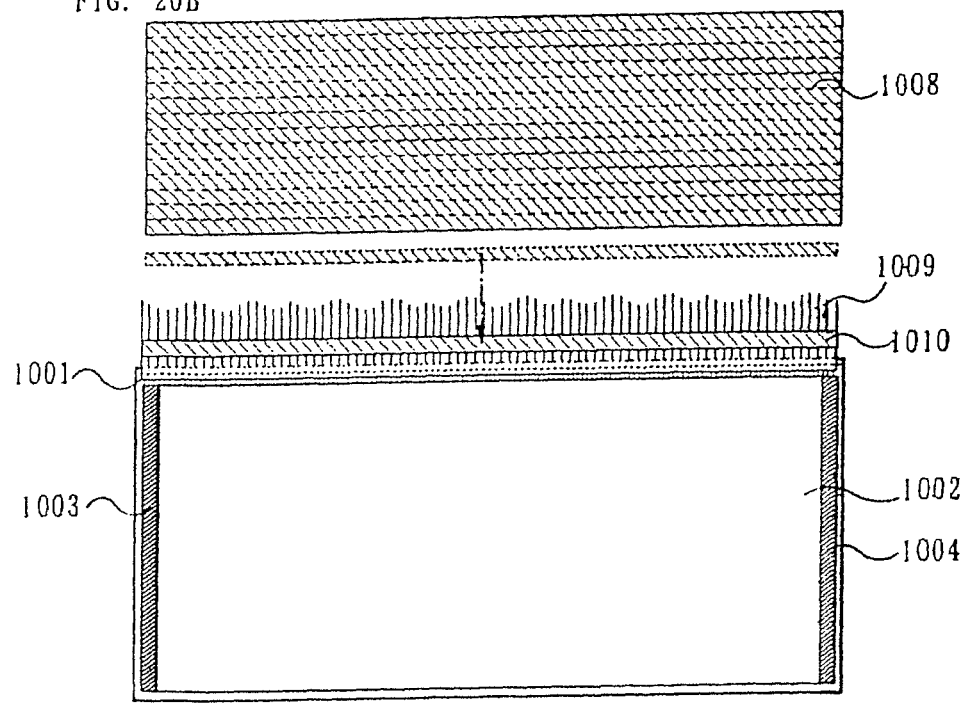

Next, a display device employing a TAB method is explained with reference to FIGS. 20A and 20B. A pixel portion 1002 and scanning line driver circuits 1003 and 1004 are provided on a substrate 1001. FIG. 20A shows a mode in which a plurality of tapes 1006 is attached onto the substrate 1001 and then, driver ICs 1007 are mounted on the tapes 1006. FIG. 20B shows a mode in which a tape 1009 is attached on the substrate 1001 and then, a driver IC 1010 is mounted on the tape 1009. In the case of applying the latter, metal pieces or the like that fixes the driver IC 1010 may be attached together in respect of the intensity.

A plurality of the driver ICs mounted on the EL display panel are preferably on rectangular substrates 1005 and 1008 having one side of 300 mm to 1000 mm or more in terms of enhancing the productivity.

A plurality of circuit patterns in which a driver circuit portion and an input/output terminal are used as one unit may be formed on the substrates 1005 and 1008, and be divided and taken out finally. As for the length of a long side of the driver IC, a rectangle with a long side of 15 mm to 80 mm and a short side of 1 mm to 6 mm may be formed in consideration of a length of one side of a pixel portion or a pixel pitch, as shown in FIGS. 19A and 20A. One side of the pixel portion 1002, or a length of one side of the pixel portion 1002 plus one side of each driver circuit 1003 and 1004 may be employed to form the driver IC, as shown in FIGS. 19B and 20B.

The primacy of the driver IC over an IC chip is the length of the longer side. When a driver IC having a longer side of 15 to 80 mm is used, the number of driver ICs that are necessary for mounting corresponding to the pixel region 1002 is smaller than that of IC chips. Therefore, process yield in manufacturing can be enhanced. When a driver IC is formed on a glass substrate, productivity is not detracted since the driver IC is not limited to a shape of a substrate used as a mother body. This is a great advantage, as compared with the case of taking out IC chips from a circular silicon wafer.

In FIGS. 19A, 19B, 20A and 20B, the driver IC 1007 or 1010 provided with a driver circuit is mounted on a region outside of the pixel region 1002. The driver ICs 1007 and 1010 are signal line driver circuits. In order to form a pixel region corresponding to a RGB full color, 3072 signal lines in a XGA class and 4800 signal lines in a UXGA class are necessary. The described above number of signal lines form a leading out line by dividing into several blocks in an edge of the pixel region 1002 and are gathered in accordance with a pitch of an output terminal of the driver ICs 1007 and 1010.

The driver IC is preferably formed from a crystalline semiconductor formed over a substrate. The crystalline semiconductor is preferable formed by being irradiated with light of a continuous-wave laser. Therefore, a continuous-wave solid state laser or gas laser is used as the oscillator for emitting the laser light. There is few crystal defects when a continuous-wave laser is used. As a result, a transistor can be manufactured by using a polycrystalline semiconductor film with a large grain size. In addition, high-speed driving is possible since mobility or a response speed is favorable, and it is possible to further improve an operating frequency of an element than that of the conventional element; therefore, high reliability can be obtained since there is few properties variations. Note that a channel-length direction of a transistor may be same as a scanning direction of laser light to further improve an operating frequency. This is because the highest mobility can be obtained when a channel length direction of a transistor and a scanning direction of laser light with respect to a substrate are almost parallel (preferably, from −30° to 30°) in a step of laser crystallization by a continuous-wave laser. A channel length direction is same as a flowing direction of current in a channel formation region, in other words, a direction in which an electric charge moves. The thusly formed transistor has an active layer including a polycrystalline semiconductor film in which a crystal grain is extended in a channel direction, and this means that a crystal grain boundary is formed almost along a channel direction.

In carrying out laser crystallization, it is preferable to narrow down the laser light largely, and a beam spot thereof preferably has a width of approximately from 1 mm to 3 mm which is the same as that of a shorter side of the driver IC. In addition, in order to ensure an adequate and effective energy density for an object to be irradiated, an irradiated region of the laser light is preferably a linear shape. However, a linear shape here does not refer to a line in a proper sense, but refers to a rectangle or an oblong with a large aspect ratio. For example, the linear shape refers to a rectangle or an oblong with an aspect ratio of 2 or more (preferably from 10 to 10000). Accordingly, productivity can be improved by making a width of a beam spot of the laser light and that of a shorter side of the driver IC even.

In FIGS. 19A and 19B and FIGS. 20A and 20B, a mode in which the scanning line driver circuit is integrally formed with the pixel portion and the driver IC is mounted as a signal line driver circuit is shown. However, the present invention is not limited to this mode, and the driver IC may be mounted as both a scanning line driver circuit and a signal line driver circuit. In that case, it is preferable to make specifications of the driver ICs to be used on the scanning line side and the signal line side different.

In the pixel region 1002, the signal line and the scanning line are intersected to form a matrix and a transistor is arranged in every intersection portion. A TFT having a channel portion formed from an amorphous semiconductor or a semi-amorphous semiconductor can be used as the transistor arranged in the pixel portion 1002, according to one aspect of the invention. An amorphous semiconductor is formed by a plasma CVD method, a sputtering method or the like. It is possible to form a semi-amorphous semiconductor at a temperature of 300° C. or less with plasma CVD. There is a feature that a film thickness necessary to form a transistor is formed in a short time even in the case of a non-alkaline glass substrate of an external size of, for example, 550 mm×650 mm. The feature of such a manufacturing technique is effective in manufacturing a display device of a large-sized screen. In addition, a semi-amorphous TFT can obtain an electron field-effect mobility of 2 to 10 cm$^2$/V·sec by forming a channel portion from an SAS. The TFT can be used as a switching element of a pixel or an element forming a scanning line driver circuit. Therefore, an EL display panel realizing a system-on-panel can be manufactured.

In FIGS. 19A, 19B, 20A and 20B, it is supposed that a scanning line driver circuit can be formed integrally on a substrate by using a TFT formed from a SAS as a semiconductor film according to Embodiment mode 3. A scanning line driver circuit and a signal line driver circuit may be both mounted as a driver IC in the case of using a TFT formed from an AS as a semiconductor film.

In that case, it is preferable that specifications of the driver ICs used on the scanning line side and the signal line side are different. For example, although a withstand voltage of about 30V for a transistor making up the driver IC on the scanning line side is required, driving frequency is 100 kHz or less and comparatively high-speed response is not required. Therefore, a channel length (L) of the transistor making up the driver IC on the scanning line side is preferably set large. On the contrary, although the transistor of the driver IC on the signal line side has a withstand voltage of about 12 V, driving frequency is about 65 MHz with 3V and high-speed response is required. Accordingly, the channel length or the like of the transistor making up the driver is preferably set with a micron rule.

As mentioned above, the driver circuit can be incorporated in the EL display panel.

Embodiment 5

A structure of a pixel of an EL display panel as shown in this embodiment is explained with reference to equivalent circuit diagrams shown in FIGS. 21A to 21F.

Figure 21A:
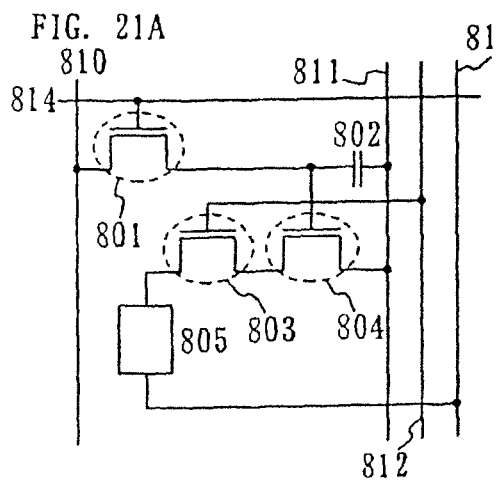
FIGS. 21A to 21F are circuit diagrams each showing a configuration of a pixel which can be applied to an EL display panel according to one aspect of the present invention.

In a pixel shown in FIG. 21A, a signal line 810 and power supply lines 811 to 813 are arranged in a column direction and a scanning line 814 is arranged in a row direction. In addition, a switching TFT 801, a driving TFT 803, a current control TFT 804, a capacitor element 802, and a light-emitting element 805 are included therein. The capacitor element 802 can be formed in another position depending on a structure, and the capacitor element 802 is not necessarily provided.

Figure 21B:
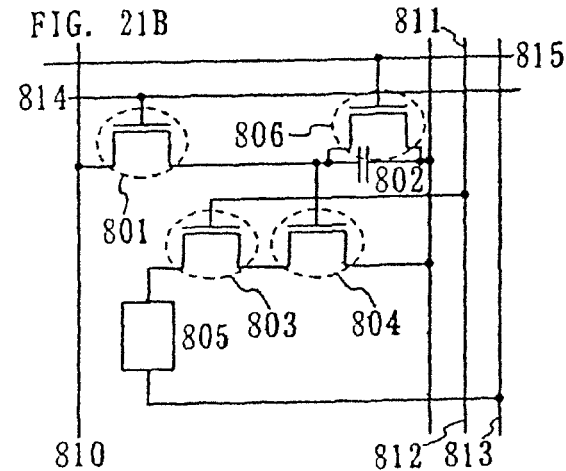
Figure 21C:
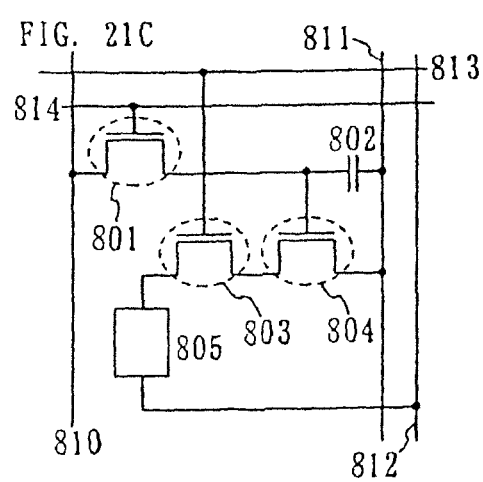

A pixel shown in FIG. 21C has the same structure as the pixel shown in FIG. 21A except that gate electrodes of the TFTs 10000 and 20000 are connected to a power supply line 813 arranged in a row direction. The pixels shown in FIG. 21A and FIG. 21C are almost the same equivalent circuit diagrams. However, the power supply lines are each formed from conductive layers in different layers in the cases where the power supply line 813 is arranged in a column direction (FIG. 21A) and the power supply line 813 is arranged in a row direction (FIG. 21C). Here, wirings connected to the gate electrodes of the TFTs 10000 and 20000 are focused and the figures are separately shown in FIGS. 21A and 21C so as to show that the wirings are formed from different layers.

In the pixels shown in FIG. 21A and FIG. 21C, TFTs 803 and 804 are connected in series. A channel length $L_3$ and a channel width $W_3$ of the TFT 803 and a channel length $L_4$ and a channel width $W_4$ of the TFT 804 are set so as to satisfy L3/W3:L4/W4=5 to 6000:1. As an example of the case satisfying 6000:1, it is a case where $L_3$ is 500 μm, $W_3$ is 3 μm, $L_4$ is 3 μm, and $W_4$ is 100 μM.

The TFT 803 operates in a saturation region and controls a current value flowing through a light-emitting element 805. The TFT 804 operates in a linear region and controls supply of current to a light-emitting device 805. It is preferable for the manufacturing step that these TFTs have the same conductive type. In addition, not only an enhancement type but also a depletion type TFT may be used for the TFT 803. In the present invention having the above-mentioned structure, the TFT 804 operates in a linear region; therefore, a slight variation of $V_{GS}$ in the TFT 804 does not affect a current value of the light-emitting element 805. In other words, the current value of the light-emitting element 805 is determined depending on the TFT 803 that operates in a saturation region. In the present invention having the above-mentioned structure, a display device in which image quality is improved by improving luminance variation resulted from variations in TFT properties can be provided.

In the pixels shown in FIGS. 21A to 21C, the 801 is a TFT for controlling input of a video signal to the pixel. When the TFT 801 turns ON and the video signal is inputted into the pixel, the video signal is stored in the capacitor element 802. FIGS. 21A and 21C each show a structure in which the capacitor element 802 is provided; however, the present invention is not limited thereto. When a gate capacitor or the like can be used as the capacitor that can hold a video signal, the capacitor element 802 may not be provided explicitly.

The light-emitting elements 805 and 844 have a structure in which an electroluminescent layer is sandwiched between two electrodes, and potential difference between a pixel electrode and an opposite electrode (between an anode and a cathode) are provided so that a forward bias voltage is applied. The electroluminescent layer is formed from a wide variety of materials such as an organic material and an inorganic material. Luminescence (fluorescence) in returning from a singlet excited state to a ground state and luminescence (phosphorescence) in returning from a triplet excited state to a ground state are included in luminescence of this electroluminescent layer.

Figure 21D:
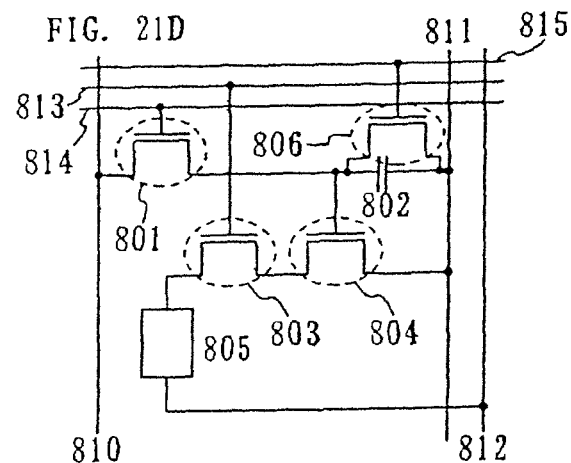

The pixel shown in FIG. 21B has the same structure as the pixel shown in FIG. 21A except that a TFT 806 and a scanning line 815 are added. In the same manner, a pixel shown in FIG. 21D is the same as the pixel structure shown in FIG. 21C except that a TFT 806 and a scanning line 815 are added.

In the TFT 806, ON or OFF is controlled by the scanning line 816 that is newly arranged. When the TFT 806 is turned ON, an electric charge held in the capacitor element 802 is discharged, and the TFT 806 is turned OFF. In other words, it is possible to make a state in which current is not forced to flow into the light-emitting element 805 by disposing the TFT 806. Accordingly, in the structures of FIGS. 21B and 21D, a lightning time can be started at the same time as or right after the beginning of a writing time, without waiting for writing signals to all pixels, thereby enhancing a duty ratio.

Figure 21E:
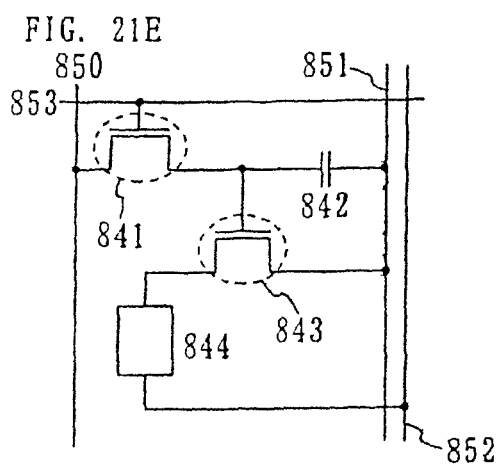
Figure 21F:
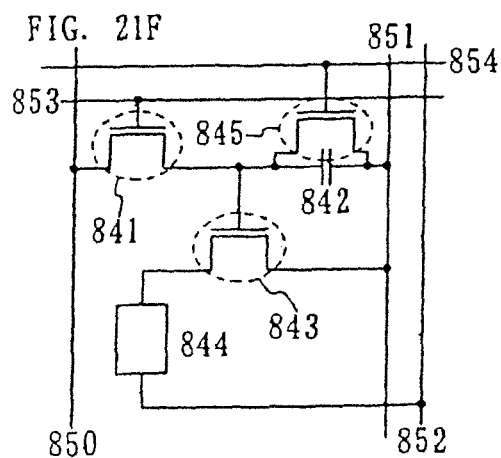

In a pixel shown in FIG. 21E, a signal line 850 and power supply lines 851 and 852 are arranged in a column direction, and a scanning line 853 is arranged in a row direction. In addition, a switching TFT 841, a driving TFT 843, a capacitor element 842, and a light-emitting element 844 are included therein. A pixel shown in FIG. 21F has the same structure as the pixel shown in FIG. 21E except that a TFT 845 and a scanning line 854 are added. A duty ratio can be increased by disposing the TFT 845 also in the structure of FIG. 21F. As described above, a driver circuit can be incorporated in an EL display panel.

Embodiment 6

Figure 15:
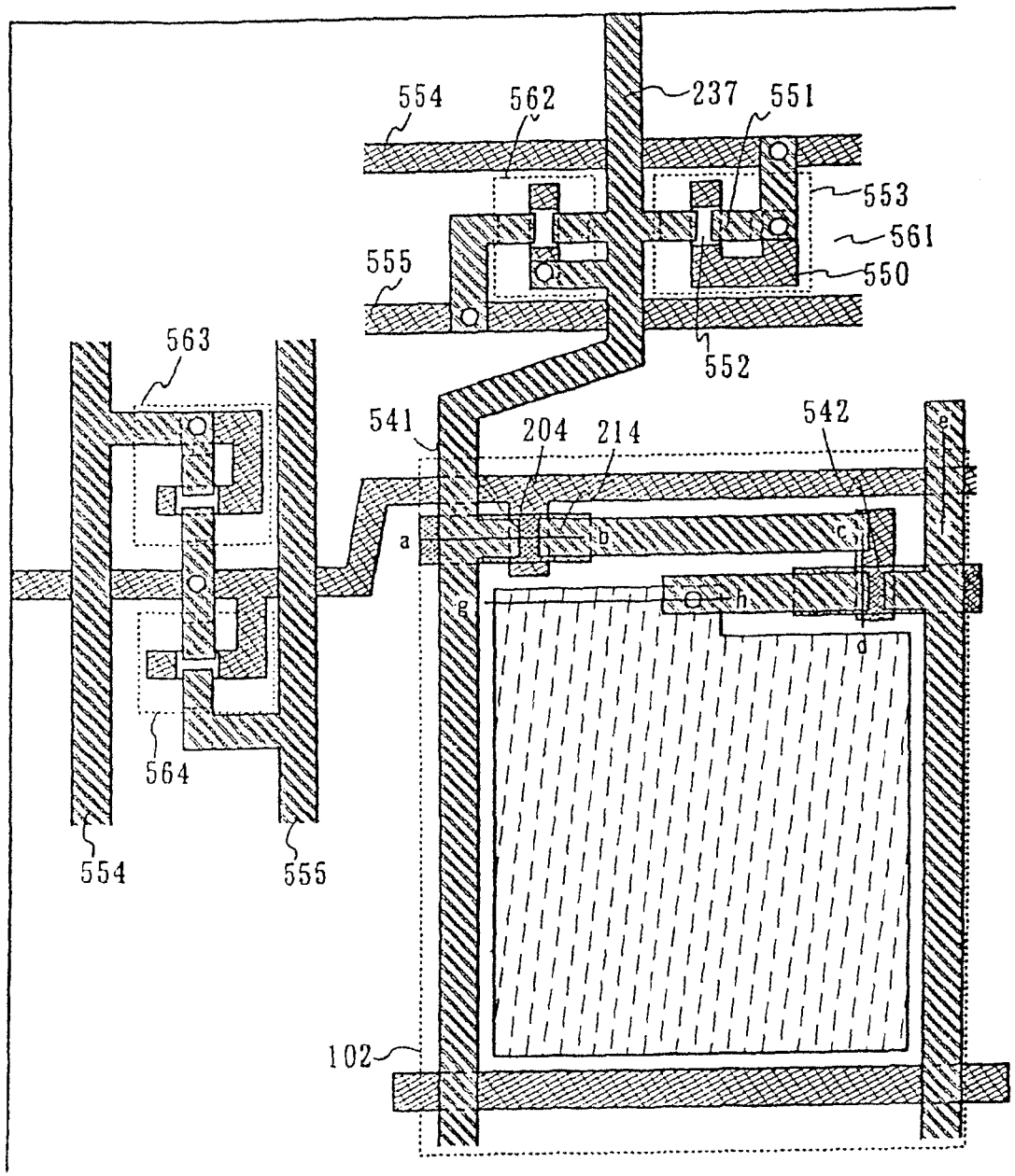
FIG. 15 is a top view showing a liquid crystal display panel according to one aspect of the present invention.

One mode in which a protection diode is provided for each of a scanning line input terminal portion and a signal line input terminal portion is explained with reference to FIG. 15. TFTs 541 and 542 are provided in a pixel 102 in FIG. 15. The TFTs have the same structure as those in Embodiment mode 1.

Protection diodes 561 and 562 are provided for the signal line input terminal portion. These protection diodes are manufactured in the same step as the TFT 541 or 542. The protection diodes 561 and 562 are operated as a diode by connecting a gate of one protection diode to one of a drain and a source of another protection diode. FIG. 16 shows an equivalent circuit diagram of the top view shown in FIG. 15.

The protection diode 561 comprises a gate electrode 550, a semiconductor film 551, a channel protective insulating layer 552, and a wiring 553. The protection diode 562 has the same structure. Common potential lines 554 and 555 connecting to these protection diodes are formed in the same layer as that of the gate electrode. Therefore, it is necessary to form a contact hole in a gate insulating layer so as to electrically connect to the wiring 553.

A mask may be formed by a droplet discharging method and an etching step may be carried out to form a contact hole in the gate insulating layer. In this case, when an etching step by atmospheric pressure discharging is applied, a local discharging process is also possible, and it does not need to form a mask over an entire surface of a substrate.

A signal wiring 237 is formed in the same layer as that of a source and drain wiring 214 in the TFT 541 and has a structure in which the signal wiring 237 connected thereto is connected to a source side or a drain side.

Protection diodes 563 and 564 of the input terminal portion of the scanning signal line side are also formed to have the same structure. According to one aspect the invention, the protection diodes provided in an input stage can be formed at the same time. Note that the position of arranging the protection diode is not limited to this embodiment, but can be also provided between a driver circuit and a pixel as shown in FIG. 3.

Embodiment 7

Figure 26:
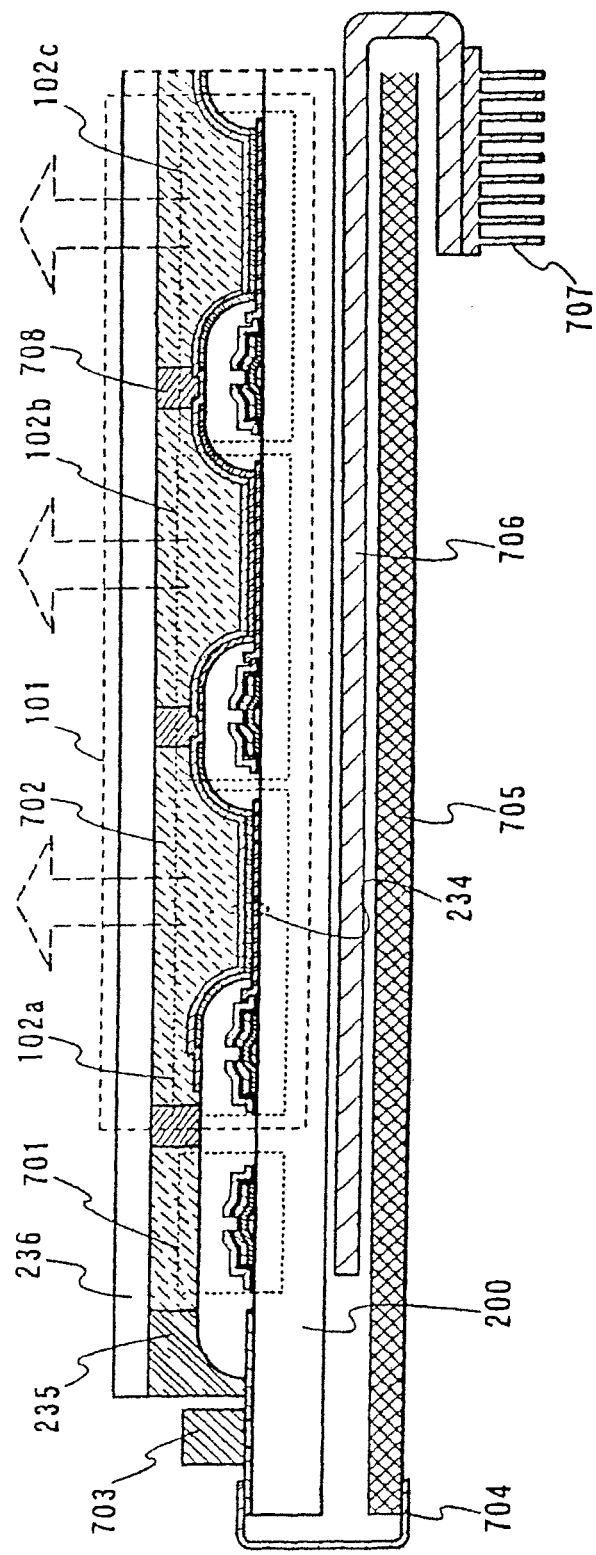
FIG. 26 is a cross-sectional view showing in a configuration example of an EL display module according to one aspect of the present invention.
Figure 27:
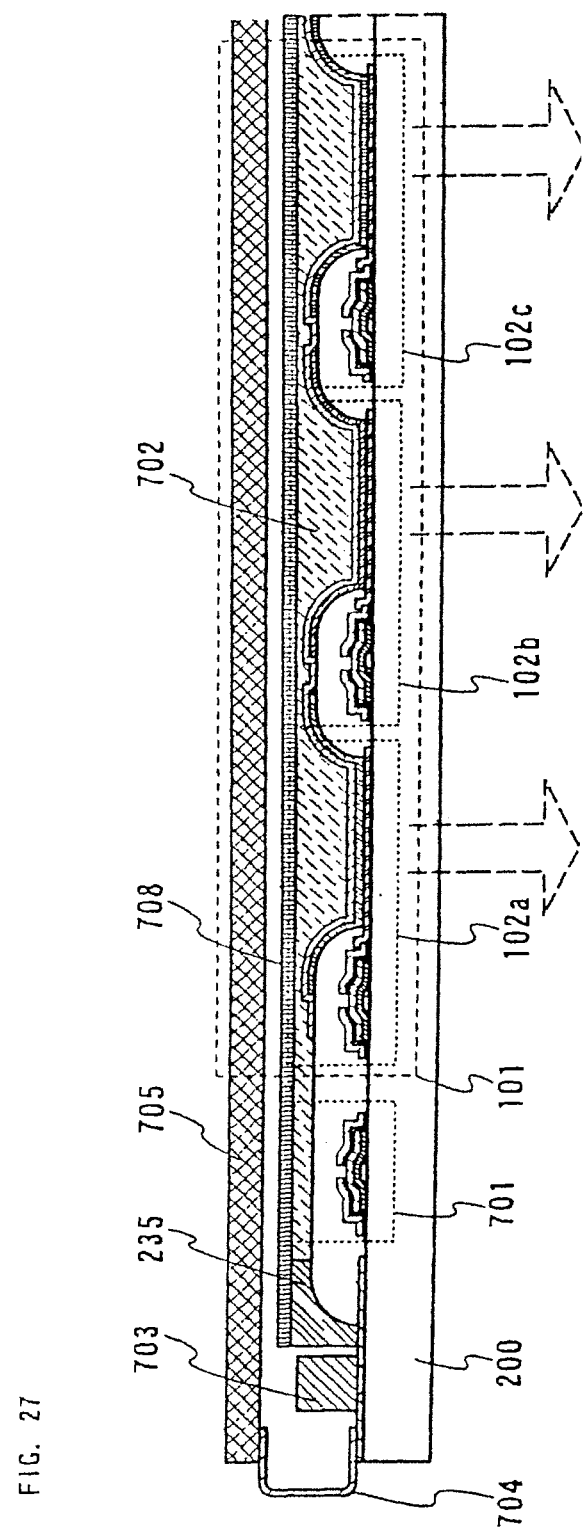
FIG. 27 is a cross-sectional view showing in a configuration example of an EL display module according to one aspect of the present invention.

FIGS. 26 and 27 each show an embodiment of constituting an EL display module by using a TFT substrate 200 manufactured by a droplet discharging method. In FIGS. 26 and 27, a pixel portion 101 comprising pixels 102a to 102c is formed on the TFT substrate 200.

In FIG. 26, the same TFT as that formed in a pixel or a protective circuit portion 701 operating in the same manner as a diode by being connected to a gate and one of a source or a drain of the TFT is provided between a driver circuit 703 and the pixels 102a to 102c and outside the pixel portion 101. A driver IC formed from a single crystal semiconductor, a stick driver IC formed from a polycrystalline semiconductor film over a glass substrate, a driver circuit formed from an SAS, or the like is applied to the driver circuit 703.

The TFT substrate 200 is fixed to a sealing substrate 236 by a spacer 708 formed on the insulating layer by a droplet discharging method. Even when the substrate has thin thickness or an area of the pixel portion is enlarged, the spacer is preferably provided to keep a gap between the two substrates constant. A light-transmitting resin material may be filled to solidify or anhydrous nitrogen or an inert gas may be filled in the gap over a light-emitting device 234 and between the TFT substrate 200 and the sealing substrate 236.

FIG. 26 shows the case where the light-emitting element 234 has a top emission type structure, in which light is radiated in a direction shown by the arrow thereof. Each pixel can carry out multicolor display by differentiating light-emitting colors by using the pixel 102a for red, the pixel 102b for green, and the pixel 102c for blue. At this time, color purity of the luminescence emitted outside can be improved by forming a colored layer corresponding to each color on the side of the sealing substrate 236. In addition, the pixels 102a, 102b, and 102c may be each used as the white light-emitting element, and combined with the colored layers.

An external circuit 705 is connected to a scanning line or signal line connection terminal provided on one end of the TFT substrate 200 with a wiring board 704. In addition, a heat pipe 706 and a heat sink 707 may be provided to be in contact with the TFT substrate 200 or in vicinity thereof to have a structure in which a heat dissipation effect is improved.

FIG. 26 shows a top emission type EL module; however, a bottom emission structure may be employed by changing the structure of the light-emitting element or the arrangement of the external circuit substrate.

FIG. 27 shows an example in which a resin film 710 is attached by using a sealant 235 and an adhesive resin 702 onto the side where a pixel portion is formed over a TFT substrate 200 to form a sealing structure. A gas barrier film preventing penetration of water vapor may be provided on the surface of the resin film 710. FIG. 27 shows a bottom emission structure in which light of a light-emitting element is emitted through the substrate; however, a top emission structure is also acceptable by giving light-transmitting properties to the resin film 710 or the adhesive resin 702. In either case, much more thin and lighter display device can be obtained by adopting a film sealing structure.

Embodiment 8

Figure 28:
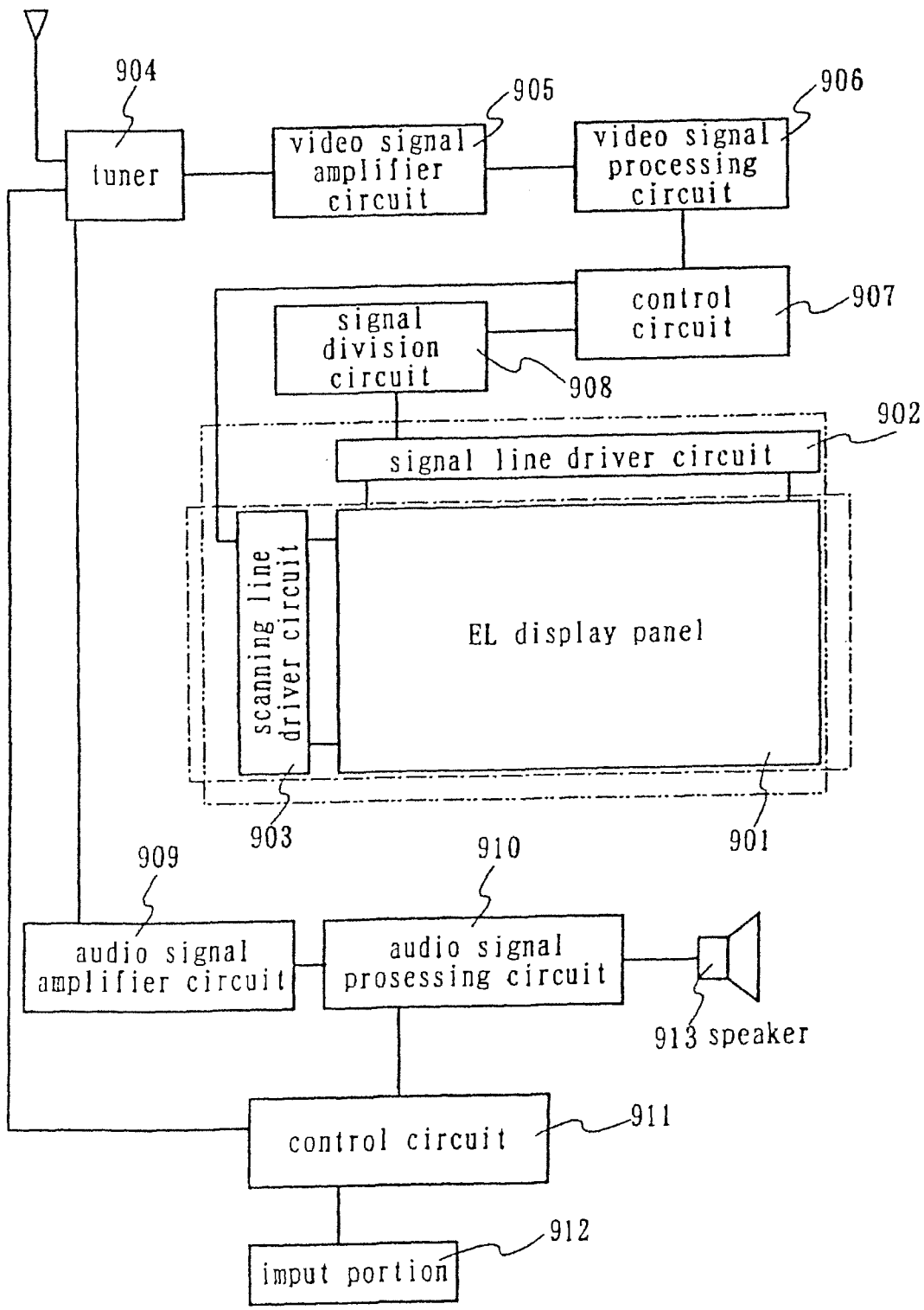
FIG. 28 is a block diagram showing a main configuration of an EL TV receiver according to one aspect of the present invention.

An EL television receiver can be completed by an EL display module manufactured according to Embodiment mode 1. FIG. 28 shows a block diagram of a main structure of the EL television receiver. There are a case where a pixel portion 101 is formed alone in an EL display panel 901 and a scanning line driver circuit 903 and a signal line driver circuit 902 are mounted by a TAB method as the structure shown in FIG. 1; and a case where the pixel portion 101 is formed in the EL display panel 901 and the scanning line driver circuit 903 and the signal line driver circuit 902 are mounted in the periphery thereof by a COG method as the structure shown in FIG. 2; a case where a TFT is formed from an SAS, and the pixel portion 101 and the scanning line driver circuit 903 are formed integrally on a substrate, and the signal line driver circuit 902 is separately mounted as a driver IC as the structure shown in FIG. 3; and the like. However, any one mode of the cases may be applied.

As another structure of an external circuit, an input side of a video signal includes a video signal amplifier circuit 905 that amplifies a video signal among signals received by a tuner 904; a video signal processing circuit 906 that converts a signal outputted from the video signal amplifier circuit 905 into a color signal corresponding to each color of red, green, and blue; a control circuit 907 for converting the video signal into an input specification of a driver IC; and the like. The control circuit 907 outputs a signal into the scanning line side and the signal line side, respectively. In the case of digital driving, a signal division circuit 908 may be provided on the signal line side and may have a structure in which input digital signals are divided into m signals and supplied.

An audio signal, among signals received from the tuner 904, is transmitted to an audio signal amplifier circuit 909, and an output signal from the audio signal amplifier circuit 909 is supplied to a speaker 913 through an audio signal processing circuit 910. A control circuit 911 receives control information of a receiving station (a receiving frequency) or sound volume from an input portion 912 and transmits a signal to the tuner 904 or the audio signal processing circuit 910.

Figure 29:
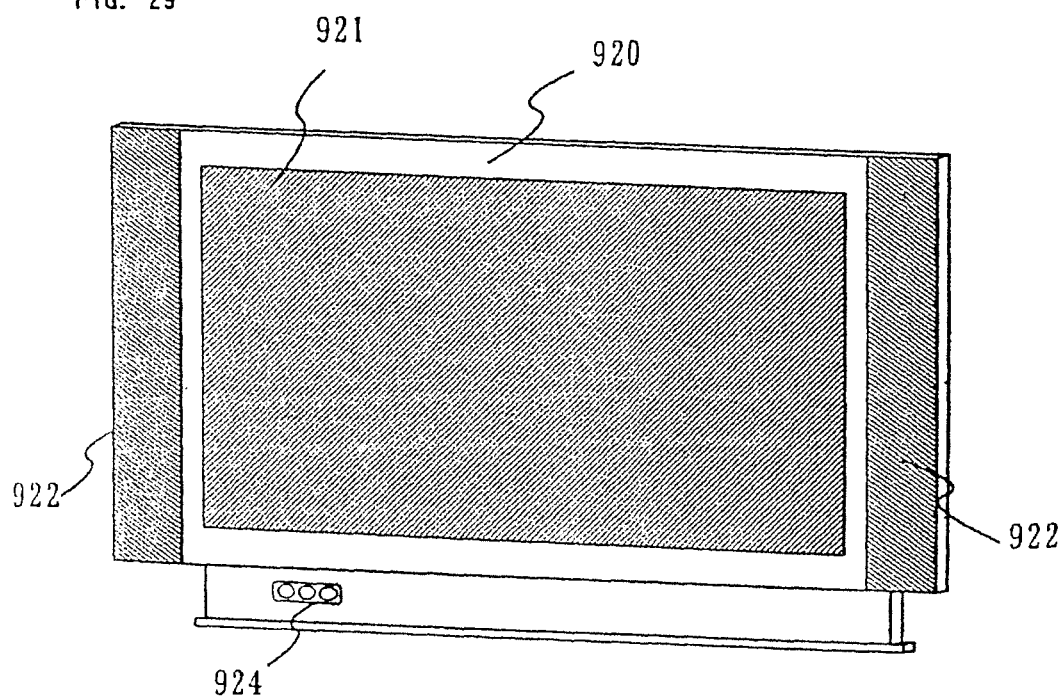
FIG. 29 shows a structure of an EL TV receiver completed according to one aspect of the present invention.

As shown in FIG. 29, a television receiver can be completed by incorporating the EL module illustrated in FIGS. 26 and 27 into a casing 920 by incorporating such an external circuit. A display screen 921 is formed by the EL display module, and a speaker 922, operation switches 924, and the like are provided as other attached equipment. Accordingly, the television receiver can be completed according to the present invention.

Of course, the present invention is not limited to the television receiver and is applicable to various use, in particular, as a display medium with a large-sized area such as an information display board at a station, an airport, etc., or an advertisement display board etc., on the street as well as a monitor of a personal computer. The present invention is not limited to a large-size substrate, and is applicable to a comparatively small display medium such as a cellular phone.

What is claimed is:

1. A light-emitting device comprising:
    a first substrate;
    a first transistor and a second transistor each over the first substrate, each of the first transistor and the second transistor comprising:
        a gate electrode comprising a conductive material;
        a semiconductor film; and
        a gate insulating layer between the gate electrode and the semiconductor film;
    a first electrode electrically connected to one of a source and a drain of the second transistor;
    an insulating layer which covers an end portion of the first electrode;
    a spacer over the insulating layer;
    an light emitting layer over the first electrode;
    a second electrode over the light emitting layer;
    a second substrate over the second electrode; and
    a resin material which fills a space between the second electrode and the second substrate,
    wherein one of a source and a drain of the first transistor is electrically connected to the gate electrode of the second transistor,
    wherein the spacer is between the second substrate and the insulating layer,
    wherein the spacer overlaps with at least part of the second transistor,
    wherein the resin material is in contact with the spacer.

2. The light-emitting device according to claim 1, wherein the semiconductor film is over the gate electrode.

3. The light-emitting device according to claim 1, wherein the gate insulating layer has an island-like shape.

4. The light-emitting device according to claim 1, further comprising a protective film over the first transistor and the second transistor.

5. The light-emitting device according to claim 1, wherein the conductive material comprises Ag, Au, Cu, W or Al as a main component.

6. The light-emitting device according to claim 1, wherein the spacer is in contact with the second substrate.

7. The light-emitting device according to claim 1, wherein the spacer keeps a gap between the first substrate and the second substrate.

8. The light-emitting device according to claim 1, wherein the spacer is formed by a droplet discharging method.

9. An electronic device comprising the light-emitting device according to claim 1.

10. A television comprises:
    a tuner configured to receive a signal;
    a circuit configured to convert the signal; and
    a light-emitting device comprising:
        a first substrate;
        a first transistor and a second transistor each over the first substrate, each of the first transistor and the second transistor comprising:
            a gate electrode comprising a conductive material;
            a semiconductor film; and
            a gate insulating layer between the gate electrode and the semiconductor film;
        a first electrode electrically connected to one of a source and a drain of the second transistor;
        an insulating layer which covers an end portion of the first electrode;
        a spacer over the insulating layer;
        an light emitting layer over the first electrode;
        a second electrode over the light emitting layer;
        a second substrate over the second electrode; and
        a resin material which fills a space between the second electrode and the second substrate,
    wherein one of a source and a drain of the first transistor is electrically connected to the gate electrode of the second transistor,
    wherein the spacer is between the second substrate and the insulating layer,
    wherein the spacer overlaps with at least part of the second transistor,
    wherein the resin material is in contact with the spacer.

11. The television according to claim 10, wherein the semiconductor film is over the gate electrode.

12. The television according to claim 10, wherein the gate insulating layer has an island-like shape.

13. The television according to claim 10, further comprising a protective film over the first transistor and the second transistor.

14. The television according to claim 10, wherein the conductive material comprises Ag, Au, Cu, W or Al as a main component.

15. The television according to claim 10, wherein the spacer is in contact with the second substrate.

16. The television according to claim 10, wherein the spacer keeps a gap between the first substrate and the second substrate.

17. The television according to claim 10, wherein the spacer is formed by a droplet discharging method.

* * * * *